(12) United States Patent
Jenney et al.

(10) Patent No.: US 12,515,058 B1
(45) Date of Patent: Jan. 6, 2026

(54) MEDICAL DEVICE INCLUDING A POUCH AND METHOD OF MANUFACTURING THE SAME

(71) Applicant: THE ALFRED E. MANN FOUNDATION FOR SCIENTIFIC RESEARCH, Valencia, CA (US)

(72) Inventors: Christopher Reed Jenney, Valencia, CA (US); Neil Talbot, La Crescenta, CA (US)

(73) Assignee: THE ALFRED E. MANN FOUNDATION FOR SCIENTIFIC RESEARCH, Valencia, CA (US)

( * ) Notice: Subject to any disclaimer, the term of this patent is extended or adjusted under 35 U.S.C. 154(b) by 383 days.

(21) Appl. No.: 18/177,545

(22) Filed: Mar. 2, 2023

Related U.S. Application Data

(60) Provisional application No. 63/317,502, filed on Mar. 7, 2022.

(51) Int. Cl.
  *A61N 1/375* (2006.01)
  *A61N 1/39* (2006.01)

(52) U.S. Cl.
  CPC ......... *A61N 1/3754* (2013.01); *A61N 1/3968* (2013.01); *A61N 1/37512* (2017.08)

(58) Field of Classification Search
  CPC . A61N 1/3754; A61N 1/3968; A61N 1/37512
  See application file for complete search history.

(56) References Cited

U.S. PATENT DOCUMENTS

| | | | | |
|---|---|---|---|---|
| 9,893,326 | B2* | 2/2018 | Seino | H01M 50/178 |
| 2005/0014036 | A1* | 1/2005 | Kim | H01M 50/55 |
| | | | | 429/176 |
| 2007/0265673 | A1* | 11/2007 | Ransbury | A61N 1/37516 |
| | | | | 607/36 |
| 2008/0128315 | A1* | 6/2008 | Buevich | A61L 31/148 |
| | | | | 514/254.1 |
| 2015/0297897 | A1* | 10/2015 | Ries | A61B 5/686 |
| | | | | 29/445 |
| 2017/0191955 | A1* | 7/2017 | Zou | A61B 5/14546 |
| 2019/0092961 | A1* | 3/2019 | Wang | C08F 2/48 |
| 2019/0351241 | A1* | 11/2019 | Novak | A61L 31/146 |
| 2021/0244954 | A1* | 8/2021 | Verzal | A61N 1/3758 |
| 2021/0283397 | A1* | 9/2021 | Gross | A61B 5/318 |
| 2021/0346705 | A1* | 11/2021 | Jiang | H01M 50/172 |

* cited by examiner

*Primary Examiner* — Catherine M Voorhees
(74) *Attorney, Agent, or Firm* — Lewis Roca Rothgerber Christie LLP

(57) ABSTRACT

A medical device including a pouch including a first portion of a flexible metal foil bonded to a second portion of the flexible metal foil to define a hermetically sealed interior volume, electronic components in the hermetically sealed interior volume, and a case around the pouch. The medical device can be designed to be rigid or have one or more flexible regions.

28 Claims, 34 Drawing Sheets

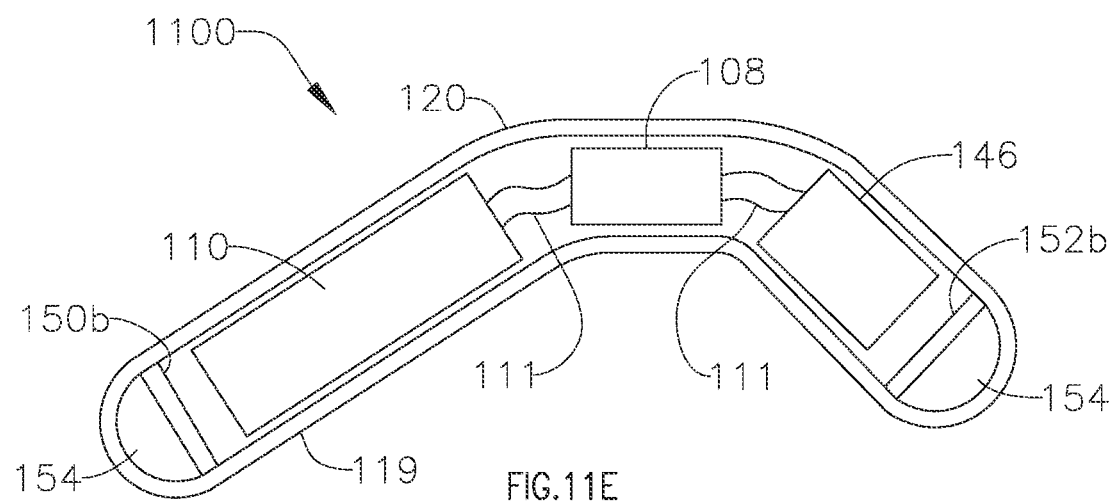

MEDICAL DEVICE INCLUDING A POUCH AND METHOD OF MANUFACTURING THE SAME

CROSS-REFERENCE TO RELATED APPLICATION(S)

The present application claims priority to and the benefit of U.S. Provisional Application No. 63/317,502, filed Mar. 7, 2022, the entire content of which is incorporated herein by reference.

BACKGROUND

1. Field

Aspects of one or more embodiments of the present disclosure relate to a medical device including a pouch and method of manufacturing the same.

2. Description of Related Art

Packaging having a hermetic seal are important for a variety of electronic and mechanical applications. Electronics and mechanical components stored within a cavity having a hermetic seal may function for longer periods of time due to reduced exposure to moisture and protection from contamination.

In the medical industry, hermetically sealed devices and instruments are important for implantable pulse generators (IPGs), implantable biosensors (e.g., implantable myoelectric sensors (IMESs)), and the like. Generally, hermeticity may be achieved with brazing and laser welding of metal and ceramic components which may introduce high cost and process complexities. Accordingly, research is being conducted into achieving hermeticity for medical devices with lower component and production costs and faster development times.

The above information disclosed in this Background section is for enhancement of understanding of the background of the present disclosure, and therefore, it may contain information that does not constitute prior art.

SUMMARY

Aspects of one or more embodiments of the present disclosure are directed toward a medical device including a hermetically sealed pouch housed within a case. The pouch may be formed of a metal foil.

Aspects of one or more embodiments of the present disclosure are directed toward a method of manufacturing a medical device including a hermetically sealed pouch housed within a case. The pouch may be formed by enclosing internal components in a metal foil and bonding portions of the metal foil together.

According to one or more embodiments of the present disclosure, there is provided a medical device, the medical device includes a pouch including a first portion of a flexible metal foil bonded to a second portion of the flexible metal foil to define a hermetically sealed interior volume, electronic components of the medical device in the hermetically sealed interior volume, and a case around the pouch.

In one or more embodiments, the flexible metal foil has a thickness in a range from about 0.00005 inches to about 0.005 inches.

In one or more embodiments, the medical device further includes a feedthrough connecting the electronic components inside the pouch to an outside of the pouch, the feedthrough including a feedthrough housing welded to a hole of the pouch, a conductive pin extending through the hole of the pouch, and an insulating member between the conductive pin and the flexible metal foil of the pouch.

In one or more embodiments, the case has an interior volume that is not hermetically sealed, and the flexible metal foil of the pouch separates the interior volume of the case from the hermetically sealed interior volume of the pouch.

In one or more embodiments, the case includes a polymer.

In one or more embodiments, the polymer is a pre-molded polymer.

In one or more embodiments, the case includes a coating on a surface of the pouch.

In one or more embodiments, the coating has a first layer and a second layer, the second layer being different in material from the first layer.

In one or more embodiments, the first layer includes a rigid polymer, and the second layer includes a soft polymer.

In one or more embodiments, the first layer and the second layer comprise different materials selected from the group consisting of OXPEKK-SC, a polyurethane, polysulfone, PVC, polyethylene, PEEK, polycarbonate, Ultem PEI, polypropylene, a polyimide, and silicone rubber.

In one or more embodiments, the medical device further includes a rigid member defining a non-flexing region of the medical device.

In one or more embodiments, the electronic components include flex circuitry corresponding to flexible regions of the case.

In one or more embodiments, the medical device is an implantable pulse generator or implantable biosensor.

In one or more embodiments, the flexible metal foil includes titanium, a titanium alloy, niobium, a niobium alloy, tantalum, a tantalum alloy, platinum, a platinum alloy, iridium, an iridium alloy, palladium, a palladium alloy, gold, a gold alloy, stainless steel, a Co—Ni—Cr—Mo alloy (e.g., MP35N), magnesium, cobalt, a cobalt alloy, nitinol, and/or combinations thereof.

According to one or more embodiments of the present disclosure, there is provided a method of manufacturing a medical device, the method includes preparing a flexible metal foil, folding the flexible metal foil around electronic components of the medical device, forming a pouch having a hermetically sealed interior volume by bonding portions of the flexible metal foil to each other, and forming a case around the pouch.

In one or more embodiments, the flexible metal foil has a thickness in a range from about 0.00005 inches to about 0.005 inches.

In one or more embodiments, the preparing the flexible metal foil includes forming a hole in the flexible metal foil. The method may further include inserting a feedthrough into the hole, and bonding a housing of the feedthrough to the flexible metal foil such that a hermetic seal is formed.

In one or more embodiments, the forming the case around the pouch includes inserting the pouch into the case, and attaching a case cap and/or a header to close the case.

In one or more embodiments, the forming the case around the pouch further includes molding a polymer to form the case prior to inserting the pouch into the case.

In one or more embodiments, the case has an interior volume that is not hermetically sealed.

In one or more embodiments, the forming the case around the pouch includes applying a coating on a surface of the pouch.

In one or more embodiments, the coating has a first layer and a second layer, the second layer being different in material from the first layer.

In one or more embodiments, the first layer includes a rigid polymer, and the second layer includes a soft polymer.

In one or more embodiments, the first layer and the second layer comprise different materials selected from the group consisting of OXPEKK-SC, a polyurethane, polysulfone, PVC, polyethylene, PEEK, polycarbonate, Ultem PEI, polypropylene, a polyimide, and silicone rubber.

In one or more embodiments, the method further includes attaching a rigid member to the pouch to define a non-flexing region of the medical device.

In one or more embodiments, the medical device is an implantable pulse generator or an implantable myoelectric sensor.

In one or more embodiments, the flexible metal foil includes titanium, a titanium alloy, niobium, a niobium alloy, tantalum, a tantalum alloy, platinum, a platinum alloy, iridium, an iridium alloy, palladium, a palladium alloy, gold, a gold alloy, stainless steel, a Co—Ni—Cr—Mo alloy (e.g., MP35N), magnesium, cobalt, a cobalt alloy, nitinol, and/or combinations thereof.

BRIEF DESCRIPTION OF THE DRAWINGS

The above and other aspects and features of the present disclosure will be more clearly understood from the following detailed description of the illustrative, non-limiting example embodiments with reference to the accompanying drawings.

FIG. 11E is a plan view illustrating a flexible cylindrical medical device according to one or more embodiments of the present disclosure.

DETAILED DESCRIPTION

Figure 1A:
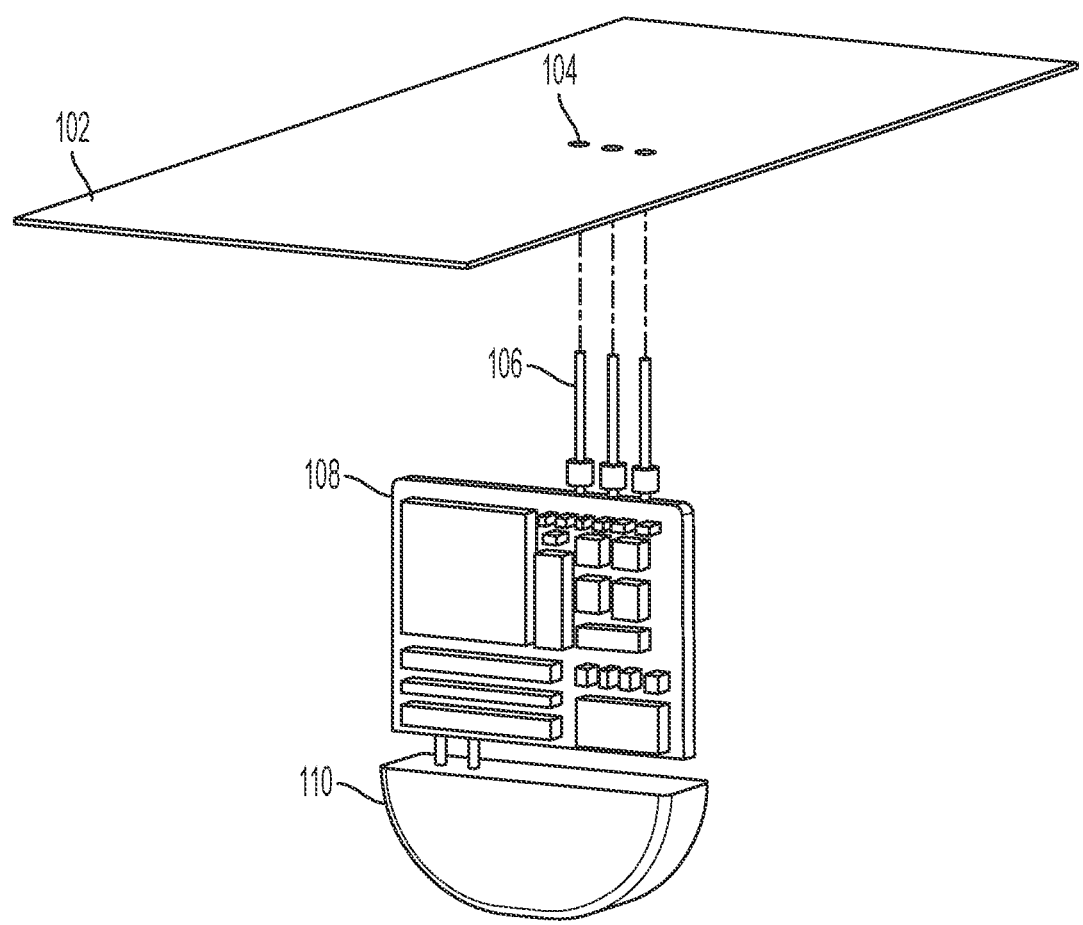
FIG. 1A is a perspective view illustrating a metal foil and internal components according to one or more embodiments of the present disclosure.

Hereinafter, example embodiments will be described in more detail with reference to the accompanying drawings, in which like reference numbers refer to like elements throughout, and duplicative descriptions thereof may not be provided. The present disclosure, however, may be embodied in one or more suitable different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described.

Generally, different metrics may be utilized to determine whether a device is hermetically sealed or has achieved hermeticity. Throughout the present disclosure, the standard generally utilized to evaluate device hermeticity is MIL-STD-883 Method 1014.11 which specifies a leak rate of less than $5 \times 10^{-8}$ atm cc/s He and is incorporated herein by reference, in its entirety. In one or more embodiments, a hermetically sealed pouch has a leak rate less than $5 \times 10^{-8}$ atm cc/s He, and therefore, the leak rate may be held to the standard $5 \times 10^{-8}$ atm cc/s He or an even stricter standard.

In related art, medical devices such as implantable pulse generators may be formed of two titanium can halves laser welded to each other to form a titanium can having an interior volume for sensitive electronic components. The electrical connections and feedthroughs of medical device may also be welded to the titanium case such that the interior volume is hermetically sealed by the titanium can. Accordingly, the titanium can may have a thickness (in inches) of about 0.006"-0.020" (e.g., 0.006"-0.020") to achieve the desired or suitable hermeticity and mechanically protect internal components. However, the laser welding process and equipment for forming the titanium can may be complex and costly. Further, only certain radii (e.g., radii corresponding to a curvature of a sidewall of a titanium can) may be achievable which limits the possible shapes and sizes for such related art medical devices, and therefore, the related art medical devices may not be able to properly conform (e.g., bend) to certain curved anatomical structures. Moreover, the related art titanium can may not have the desired or suitable degree of flexibility (i.e., may be too rigid) for a flexible medical device.

Therefore, according to one or more embodiments of the present disclosure, a thin, flexible metal foil may be utilized to form a hermetically sealed pouch that protects electronic components and/or other internal components within the pouch. For example, in one or more embodiments, the metal foil may have a thickness (in inches) of 0.00005"-0.005" (e.g., 0.00005"-0.005") and may be flexible (e.g., foldable, rollable, and/or pliable). Flexibility of the metal foil according to one or more embodiments of the present disclosure may depend on the thickness of the metal foil and the type of metal foil used.

Due to the small form factor and flexibility of the metal foil, a pouch formed by the metal foil may be utilized with and/or conform (e.g., bend) to a variety of internal components. For example, the metal foil may be folded or wrapped around electronic components and/or other internal components of varying shapes and/or sizes and bonded to form a hermetically sealed pouch. As an example, the metal foil may contact insulating or non-conductive structures spacing the electronic components and/or other internal components of varying shapes and/or sizes from the metal foil. The pouch may be enclosed in a protective outer case such as a pre-molded snap-on (e.g., a pre-molded polymer snap-on), a coating (e.g., a coating formed by dip coating, spray coating, spin coating, or casting) that conforms (e.g., bends) to the shape of the metal foil, and/or the like.

Because the pouch may provide a hermetically sealed environment for electronic components and/or other internal components within the pouch to protect them from exposure to moisture, tissue, and/or the like, a case (e.g., an outer case) around the pouch may not need to be hermetically sealed. As such, in one or more embodiments, the contents of the case may not be hermetically sealed while the contents of the pouch are hermetically sealed. Accordingly, the case may primarily provide mechanical protection (e.g., protect the pouch from striking, jostling, and/or the like) and be suitably shaped (e.g., no sharp corners or edges) for a desired or suitable environment (e.g., a subcutaneous environment adjacent or proximate to a desired anatomic structure).

One or more embodiments of the present disclosure are directed toward a flexible medical device including the pouch having a hermetically sealed interior. In this case, the case, contents of the case, the pouch, and/or contents of the pouch may be adapted or arranged to allow flexing such that the medical device has one or more flexible regions and/or non-flexing regions (e.g., rigid regions).

Figure 2:
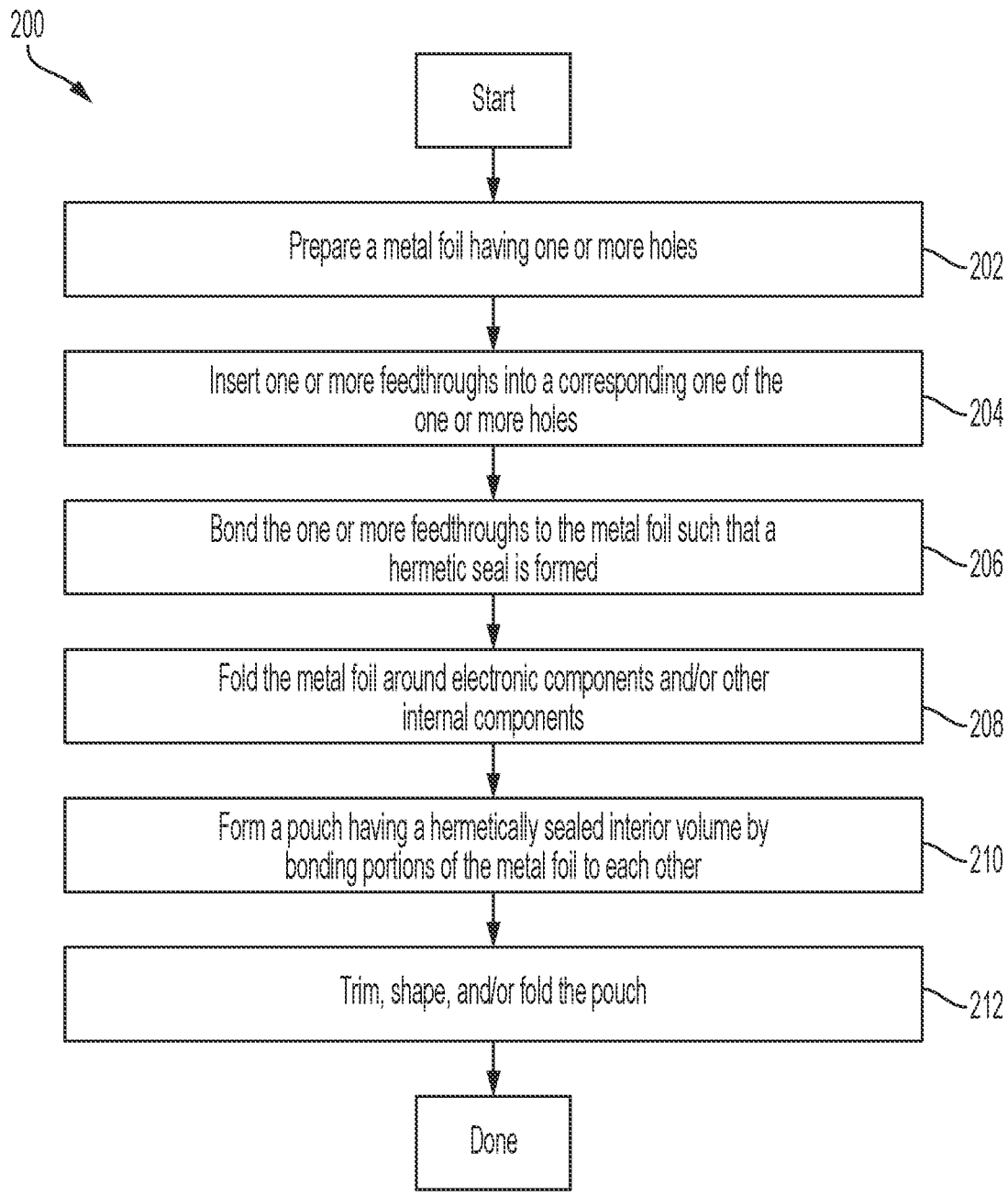
FIG. 2 is a flow chart illustrating a method of preparing a pouch enclosing internal components according to one or more embodiments of the present disclosure.

FIG. 1A is a perspective view illustrating a metal foil and internal components according to one or more embodiments of the present disclosure. FIG. 2 is a flow chart illustrating a method of preparing a pouch enclosing internal components according to one or more embodiments of the present disclosure.

With reference to FIGS. 1A and 2, a method (200) of preparing a pouch in accordance with one or more embodiments of the present disclosure includes preparing a metal foil 102 having one or more holes 104 (202). The one or more holes 104 may be formed in the metal foil 102 utilizing any suitable method such as stamping, cutting, drilling, and/or the like. The one or more holes (or through holes) 104 may be holes extending through the metal foil 102 and may provide an opening for electrical connectors and/or other instruments extending through the metal foil 102. For example, in one or more embodiments, an electrical connector such as a feedthrough 106 may extend through the holes 104 and connect electronic components 108 and/or a battery 110 at a side of the metal foil 102 to electronics and/or nerves, muscles, etc. of a patient at an opposite side of the metal foil 102. Accordingly, when the pouch is formed, the feedthroughs 106 supply electrical signals through the metal foil 102 between electronic components 108 and/or the battery 110 inside the pouch to an exterior of the pouch.

When accommodating a feedthrough 106, corresponding ones of the one or more holes 104 may be slightly undersized relative to the feed through 106. For example, the one or more holes 104 may be shaped and/or sized to form a stop between the metal foil 102 and a portion of the feedthrough 106 thereby enabling an interference fit between the feedthrough 106 and the metal foil 102. The interference fit may help create a minimal or reduced gap for moisture diffusion as will be described in more detail below.

The metal foil 102 may include any suitable biocompatible and biostable metal foil. In one or more embodiments, the metal foil may include titanium (Ti), a titanium (Ti) alloy, platinum (Pt), a platinum alloy (Pt), iridium (Ir), an iridium (Ir) alloy, gold (Au), a gold (Au) alloy, niobium (Nb), a niobium (Nb) alloy, tantalum (Ta), a tantalum (Ta) alloy, palladium (Pd), a palladium (Pd) alloy, stainless steel, a cobalt-nickel-chromium-molybdenum (Co—Ni—Cr—Mo) alloy (e.g., MP35N), magnesium (Mg), cobalt (Co), a cobalt (Co) alloy, nitinol, and/or combinations thereof. For example, the metal foil may include a titanium alloy (e.g., Grade 1 (commercially pure) titanium alloy or grade 5 (6Al-4V) titanium alloy), stainless steel (e.g., Grade 316L stainless steel), a platinum-iridium alloy (Pt—Ir), a gold alloy, a niobium alloy, a tantalum alloy, a palladium alloy, and/or a combination thereof. However, the present disclosure is not limited thereto.

In one or more embodiments, the thickness of the metal foil 102 may vary for different applications depending on welding parameters, handling, and hermeticity findings. As such, in one or more embodiments, the metal foil may be between about 0.00005"-0.005" in thickness (inches). However, the present disclosure is not limited thereto.

Figure 1B:
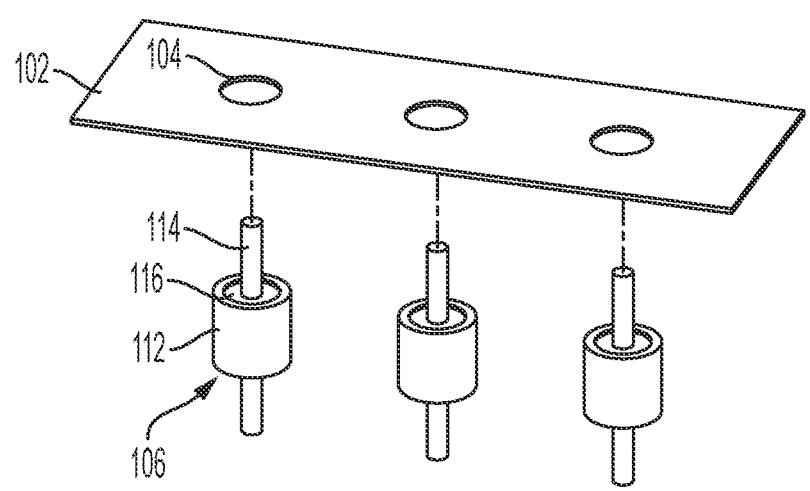
FIG. 1B is an enlarged perspective view illustrating holes of a metal foil in alignment with feedthroughs according to one or more embodiments of the present disclosure.

FIG. 1B is an enlarged perspective view illustrating holes of a metal foil in alignment with feedthroughs according to one or more embodiments of the present disclosure.

With reference to FIG. 1B, each of the feedthroughs 106 may include one or more conductive pins 114, an insulating member 116 around (e.g., surrounding) the one or more conductive pins 114, and a housing 112 around (e.g., surrounding) the insulating member 116. In one or more embodiments, the insulating member 116 may include any suitable insulating material such as brazed ceramic and/or the like, and may be between the one or more conductive pins 114 and the housing 112.

The insulating member 116 may surround a periphery or circumference of each of the one or more conductive pins 114 to electrically isolate the one or more conductive pins 114 from each other and the metal foil 102. Further, the entirety of the one or more conductive pins 114 may be spaced from the metal foil 102 to be electrically disconnected from the metal foil 102.

The one or more conductive pins 114 and the housing 112 of the feedthroughs 106 in accordance with one or more embodiments of the present disclosure may be any suitable shape and size. For example, the one or more conductive pins 114 and the housing 112 of the feedthroughs 106 may have a circular, rectangular, or other non-circular profile (e.g., shape). As shown in FIG. 1B, for illustrative purposes, the one or more conductive pins 114 and/or the housing 112 of the feedthroughs 106 may have a circular profile or shape and have the same size as each other. However, the present disclosure is not limited thereto. For example, the one or more conductive pins 114 may be different from each other in shape and/or size. Similarly, the housing 112 of the feedthroughs 106 may be different from each other in shape and/or size. In one or more embodiments, a different number of pins 114 may extend through respective holes 104 with suitable changes to the housing 112.

Figure 1C:
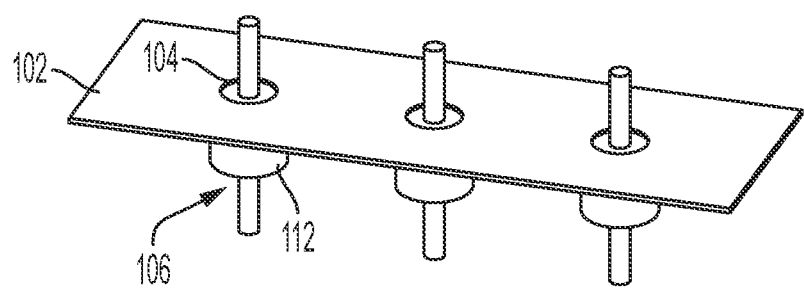
FIG. 1C is an enlarged perspective view illustrating contact between a metal foil and feedthroughs according to one or more embodiments of the present disclosure.

FIG. 1C is an enlarged perspective view illustrating contact between a metal foil and feedthroughs according to one or more embodiments of the present disclosure.

With reference to FIGS. 1C and 2, the method (200) of preparing a pouch in accordance with one or more embodiments of the present disclosure includes inserting one or more feedthroughs 106 into a corresponding one of the one or more holes 104 (204). The one or more holes 104 may be large enough to accommodate corresponding ones of the one or more conductive pins 114 but may be small enough to prevent the entirety of the inserted feedthrough 106 from passing through the one or more holes 104. In this case, a stop may be formed by a portion of the feedthrough 106 (e.g., the housing 112 of the feedthroughs 106) contacting or abutting against a portion of the metal foil 102 (e.g., a portion of the metal foil 102 defining and/or surrounding a hole 104). Therefore, the feedthrough 106 may be inserted into a corresponding hole 104 of the metal foil 102 until the feedthrough 106 reaches the stop thereby forming an interference-fit. As such, the one or more holes 104 may be used to align feedthroughs 106.

Although a stop based on an interference-fit is described (e.g., an interference-fit using a shoulder of the housing 112 of the feedthroughs 106), the present disclosure is not limited thereto. For example, the one or more feedthroughs 106 may be inserted into a corresponding one of the one or more holes 104 (204) and the feedthroughs 106 may form a butt joint with the metal foil 102. In this case, a butt joint may be formed between a surface (e.g., an edge or a side) of the housing 112 of the feedthrough 106 and a surface (e.g., an edge or a side) of the metal foil 102. The surface of the housing 112 of the feedthrough 106 and the surface of the metal foil 102 may be joined using any suitable bonding technique.

Upon reaching the stop, the one or more feedthroughs 106 and the metal foil 102 may be arranged such that the one or more conductive pins 114 of the feedthroughs 106 do not contact the metal foil 102. For example, the one or more conductive pins 114 may be aligned and centered inside corresponding ones of the one or more holes 104 of the metal foil 102 with a space and/or insulating member 116 between each of the one or more conductive pins 114 and the metal foil 102. In this case, as shown in FIG. 1C, only the housing 112 of the feedthroughs 106 may contact the metal foil 102. However, the present disclosure is not limited thereto.

Figure 1D:
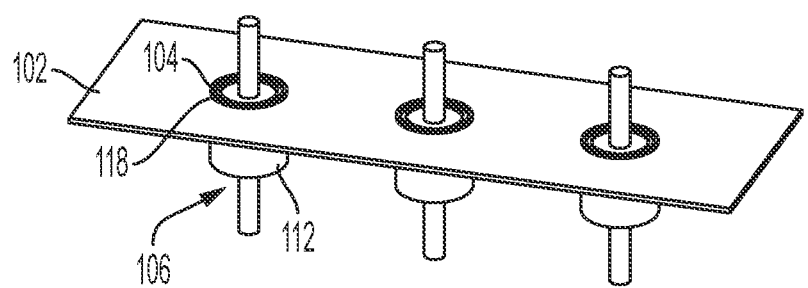
FIG. 1D is an enlarged perspective view illustrating bonding regions between a metal foil and feedthroughs according to one or more embodiments of the present disclosure.

FIG. 1D is an enlarged perspective view illustrating bonding regions (e.g., a top surface of the bonded volume) between a metal foil and feedthroughs according to one or more embodiments of the present disclosure.

With reference to FIGS. 1D and 2, the method (200) of preparing a pouch in accordance with one or more embodiments of the present disclosure includes bonding the one or more feedthroughs 106 to the metal foil 102 such that a hermetic seal is formed (206). The bonding may be any suitable form of bonding including energetic bonding (e.g., thermal bonding such as laser welding or resistance welding, ultrasonic bonding, and/or the like) and/or adhesive bonding (e.g., adhesive bonding utilizing an epoxy and/or the like) such that a hermetic seal is formed. In one or more embodiments, the bonding forming the hermetic seal is non-adhesive bonding.

Because the metal foil 102 is utilized to prepare the pouch, resistance welding as opposed to laser welding may be used to bond the one or more feedthroughs 106 to the metal foil 102 such that a hermetic seal is formed. By not utilizing laser welding in accordance with one or more embodiments, the cost of manufacturing the housing of the medical device may be significantly reduced. However, the present disclosure is not limited thereto. For example, the one or more feedthroughs 106 may be laser welded to the metal foil 102 with the added expense associated with the laser welding equipment and process.

As shown in FIGS. 1B-1D, in one or more embodiments, only the housing 112 of the one or more feedthroughs 106 may be bonded to the metal foil 102. For example, an upper portion of the housing 112 may be welded to a portion 118 of the metal foil 102 adjacent to a hole 104.

Although only the housing 112 is shown as welded to the metal foil 102 in FIGS. 1B-1D, the present disclosure is not limited thereto. For example, in one or more embodiments, the insulating member 116 and/or other portions of the feedthrough 106 may be bonded to the metal foil 102 by, for example, a biostable epoxy. Further, in one or more embodiments, the upper portion of the housing 112 may be adhesively bonded to the portion 118 of the metal foil 102 utilizing, for example, an epoxy.

By bonding the one or more feedthroughs 106 in accordance with one or more embodiments of the present disclosure, hermeticity may be achieved when the pouch is fully formed and the conductive pins 114 of feedthroughs 106 may supply electrical signals through the metal foil 102 between electronic components 108 and/or the battery 110 inside a pouch formed by the metal foil 102 and an exterior of the pouch. For example, a first end of a conductive pin 114 of the feedthroughs 106 may be directly connected to the electronic components 108 (e.g., internal electronic components including a circuit, a substrate, one or more coils, and/or the like) inside the pouch and a second end opposite to the first end may be connected to an external electrical component and/or body tissue outside the pouch.

Figure 1E:
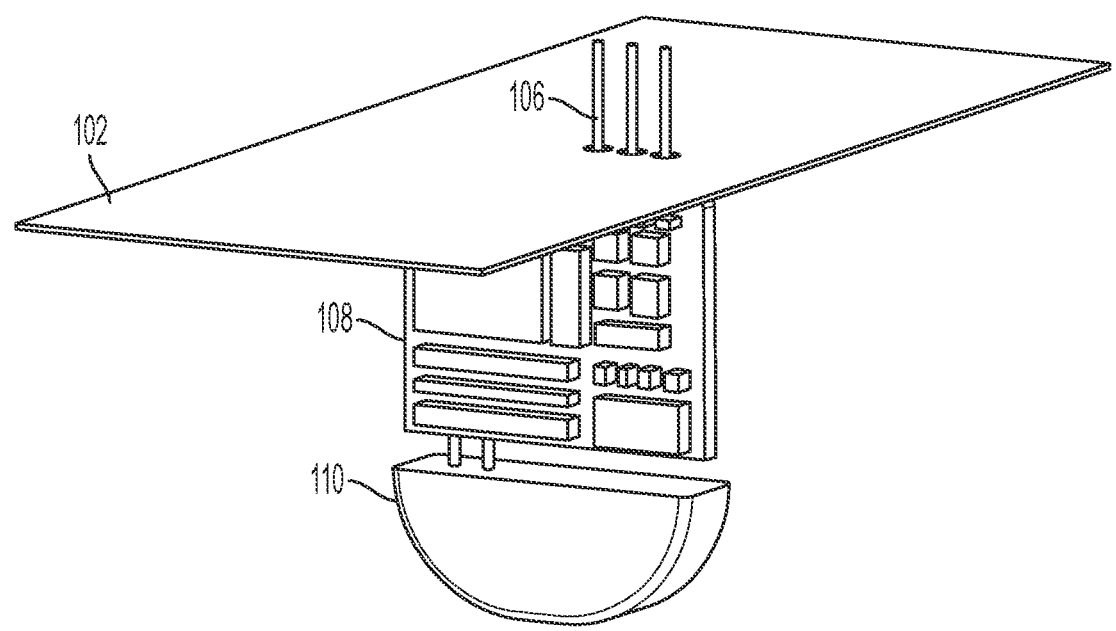
FIG. 1E is a perspective view illustrating feedthroughs bonded to a metal foil according to one or more embodiments of the present disclosure.
Figure 1F:
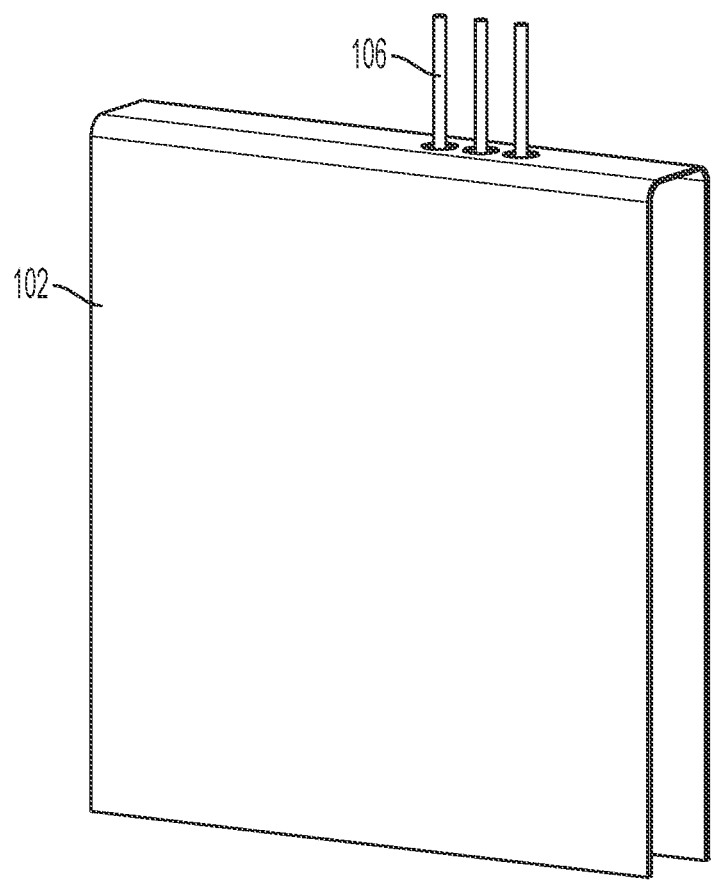
FIG. 1F is a perspective view illustrating a folded metal foil bonded to feedthroughs and enclosing internal components according to one or more embodiments of the present disclosure.

FIG. 1E is a perspective view illustrating feedthroughs bonded to a metal foil according to one or more embodiments of the present disclosure. FIG. 1F is a perspective view illustrating a folded metal foil (e.g., the metal foil 102 of FIG. 1E folded) bonded to feedthroughs and enclosing internal components according to one or more embodiments of the present disclosure.

With reference to FIGS. 1E, 1F, and 2, the method (200) of preparing a pouch in accordance with one or more embodiments of the present disclosure includes folding the metal foil 102 around electronic components 108 (e.g., electronic components 108 connected to the one or more feedthroughs 106) and/or other internal components (e.g., the battery 110) (208). When folding the metal foil 102 to enclose the electronic components 108 and/or the battery 110, care should be taken to prevent the metal foil 102 from undesirably forming electrical connections with the electronic components 108.

For example, an electrical insulator or electrically insulating film such as polyethylene terephthalate (PET), polyetheretherketone (PEEK), a polyimide film (e.g., Kapton®, a registered trademark of E.I. DuPont de Nemours and Co., a Delaware Corporation), liquid crystal polymer (LCP), polytetrafluoroethylene (PTFE), and/or mica may be provided between the metal foil 102 and internal components (e.g., the electronic components 108). In this case, an outer surface of the electrical insulator or electrically insulating film may contact the metal foil 102 and an inner surface of the electrical insulator or electrically insulating film may contact internal components to prevent or substantially prevent an undesirable electrical connection from being formed between the metal foil 102 and the electronic components 108. However, the present disclosure is not limited thereto.

In one or more embodiments, the metal foil 102 may be wrapped around one or more frames around the electronic components 108, a portion of the electronic components 108, and/or the battery 110. In this case, the metal foil 102 may be spaced from portions of the electronic components 108 that may undesirably form electrical connections. However, the present disclosure is not limited thereto. For example, in one or more embodiments, frames are not present as the metal foil 102 may be wrapped around internal components without the use of any frames. In this case, the entirety of the pouch 120 may be formed of the metal foil 102.

Accordingly, any suitable arrangement or combination of arrangements may be utilized to electrically isolate the metal foil 102 from the electronic components 108. For example, both a frame and an electrical insulator may be provided to prevent the metal foil 102 from forming an electrical connection with the electronic components 108.

As shown in FIG. 1F, the metal foil 102 may be in-folded around opposite sides of the electronic components 108 and/or the battery 110. For example, the metal foil 102 may be folded to form a U-shape with three open ends (e.g., openings) defined by an outer edge of the metal foil 102. In this case, to form a pouch, the three open ends (e.g., openings) may be closed by pressing, pinching, or folding portions (e.g., edges and/or sides) of the metal foil 102 together and energetically bonding (e.g., welding) the contacting portions to close the open ends.

Figure 1G:
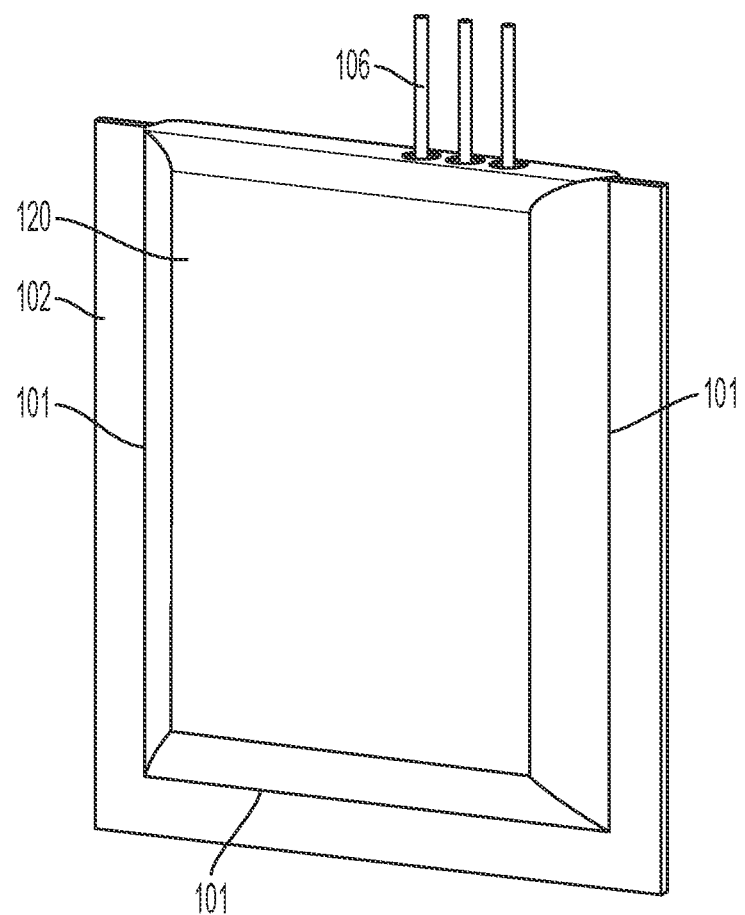
FIG. 1G is a perspective view illustrating a pouch bonded to feedthroughs and enclosing internal components according to one or more embodiments of the present disclosure.

FIG. 1G is a perspective view illustrating a pouch bonded to feedthroughs and enclosing internal components according to one or more embodiments of the present disclosure.

With reference to FIGS. 1G and 2, the method (200) of preparing a pouch 120 in accordance with one or more embodiments of the present disclosure includes forming a pouch 120 having a hermetically sealed interior volume by bonding portions of the metal foil to each other (210). For example, the open ends shown in FIG. 1F may be sealed to become closed ends as shown in FIG. 1G. In this case, the open ends may be hermetically sealed by bonding the portions (e.g., edges and/or sides) of the metal foil 102 at the closed ends to each other. The hermetic seal may be formed by energetically bonding (e.g., thermal bonding such as laser welding or resistance welding, ultrasonic bonding, and/or the like) portions of the metal foil 102 to each other. In one or more embodiments, one or more seam welds 101 may be applied as shown in FIG. 1G. However, the present disclosure is not limited thereto.

To perform welding, any suitable device and process may be utilized with suitable changes depending on the approach utilized. For example, laser welding, resistance welding, ultrasonic welding, and/or the like may be utilized with suitable equipment.

In the case of laser welding, laser welding may utilize specialized equipment and a shielding gas to weld the edges and/or sides of the metal foil 102 together. For a less expensive approach, a handheld seam resistance welder may be utilized. In contrast, a more controlled or selected, mechanized resistance welding approach may also be utilized for high volume applications. Similarly, a one-shot ultrasonic weld may also be utilized to weld the metal foil 102 and form the pouch 120 in one operation.

In one or more embodiments, a resistance or ultrasonic weld may also be completed by a series of overlapping linear welds. Further, two or three parallel welds utilizing any welding method may be utilized to maximize or increase reliability. Prior to final bonding (e.g., final welding), the pouch 120 may be filled with a dry inert gas.

Although a particular method of folding and bonding open ends is described and shown with reference to FIGS. 1E and 1F, the present disclosure is not limited thereto. For example, the metal foil 102 is flexible or pliable such that any suitable order and/or arrangement of folding and welding may be utilized to enclose electronic components 108 and/or the battery 110 in a hermetically sealed environment.

Further, the metal foil 102 may be folded to achieve shapes (e.g., have radii) that may not be present in related art medical devices (e.g., related art medical devices utilizing titanium cans). For example, the metal foil 102 may be folded into a shape having a radius (e.g., a bend radius) as small as the thickness of the metal foil 102 which may not be possible with related art Ti can forming techniques. As such, pouches 120 having a variety of shapes and including a hermetically sealed interior may be formed in accordance with one or more embodiments of the present disclosure.

In one or more embodiments, the metal foil 102 may conform (e.g., bend) or be adapted to the overall shape or profile of contents (e.g., the electronic components 108 and/or the battery 110) enclosed in a pouch 120 formed by the metal foil 102. As such, a pouch 120 formed by the metal foil 102 may have the same overall shape or profile as the overall shape or profile of the contents of the pouch 120, such as electronic components 108 and/or the battery 110.

Figure 1H:
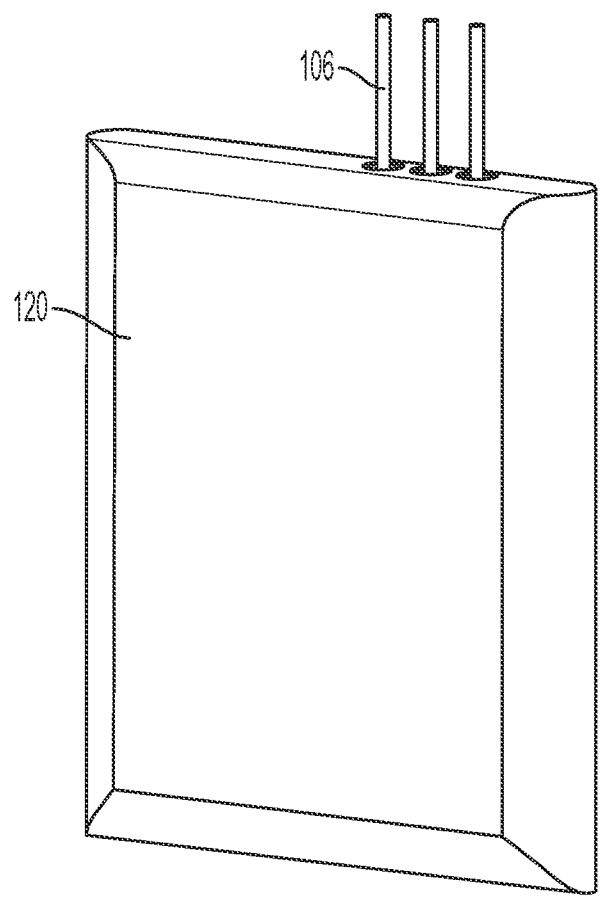
FIG. 1H is a perspective view illustrating a pouch bonded to feedthroughs and enclosing internal components according to one or more embodiments of the present disclosure.

FIG. 1H is a perspective view illustrating a pouch bonded to feedthroughs and enclosing internal components according to one or more embodiments of the present disclosure.

With reference to FIGS. 1H and 2, the method (200) of preparing a pouch 120 in accordance with one or more embodiments of the present disclosure includes trimming, shaping, and/or folding the pouch 120 (212). For example, after forming a pouch 120 having a hermetically sealed interior volume by bonding portions of the metal foil 102 to each other (210), edges of the metal foil 102 may be trimmed, folded, and shaped to ensure a good or suitable fit inside an outer case. In one or more embodiments, the metal foil 102 may be shaped to reduce the chance of sharp contents (e.g., the electronic components 108 and/or other internal components) of the pouch 120 from puncturing the metal foil 102 of the pouch 120. Depending on the contents of the pouch 120, in one or more embodiments, the pouch 120 may further include a protective film such as polyetheretherketone (PEEK) or a polyimide film (e.g., Kapton®) between other contents of the pouch 120 and the metal foil 102 to reduce the risk of metal foil damage.

Figure 3A:
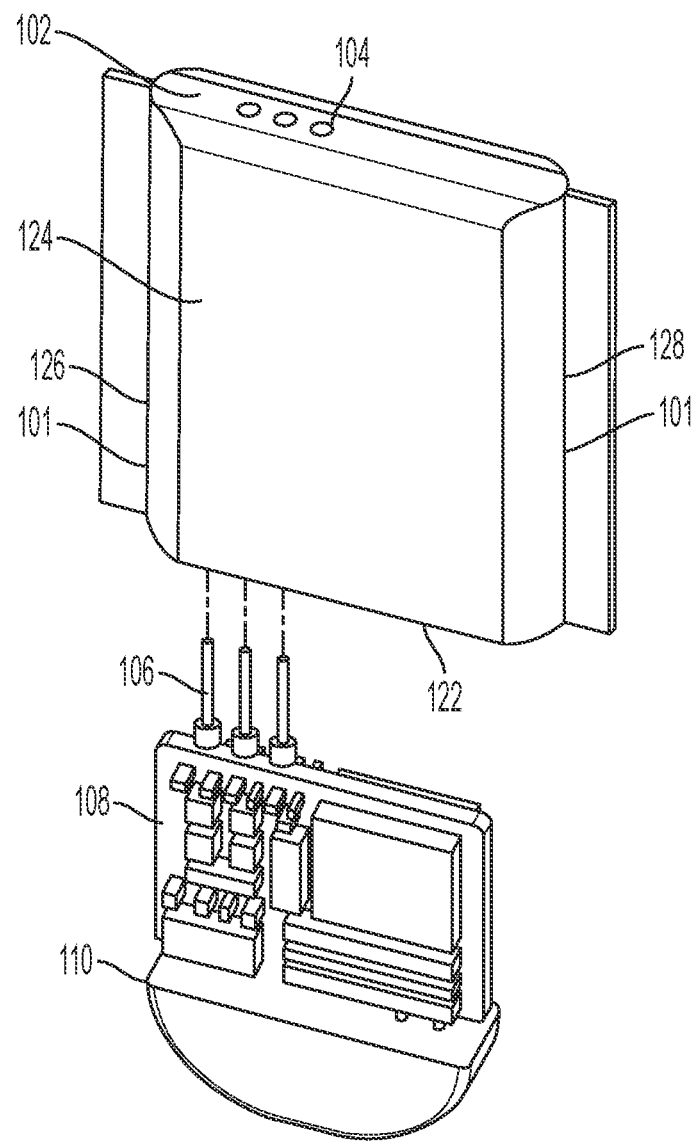
FIG. 3A is a perspective view illustrating a metal foil and internal components according to one or more embodiments of the present disclosure.
Figure 4:
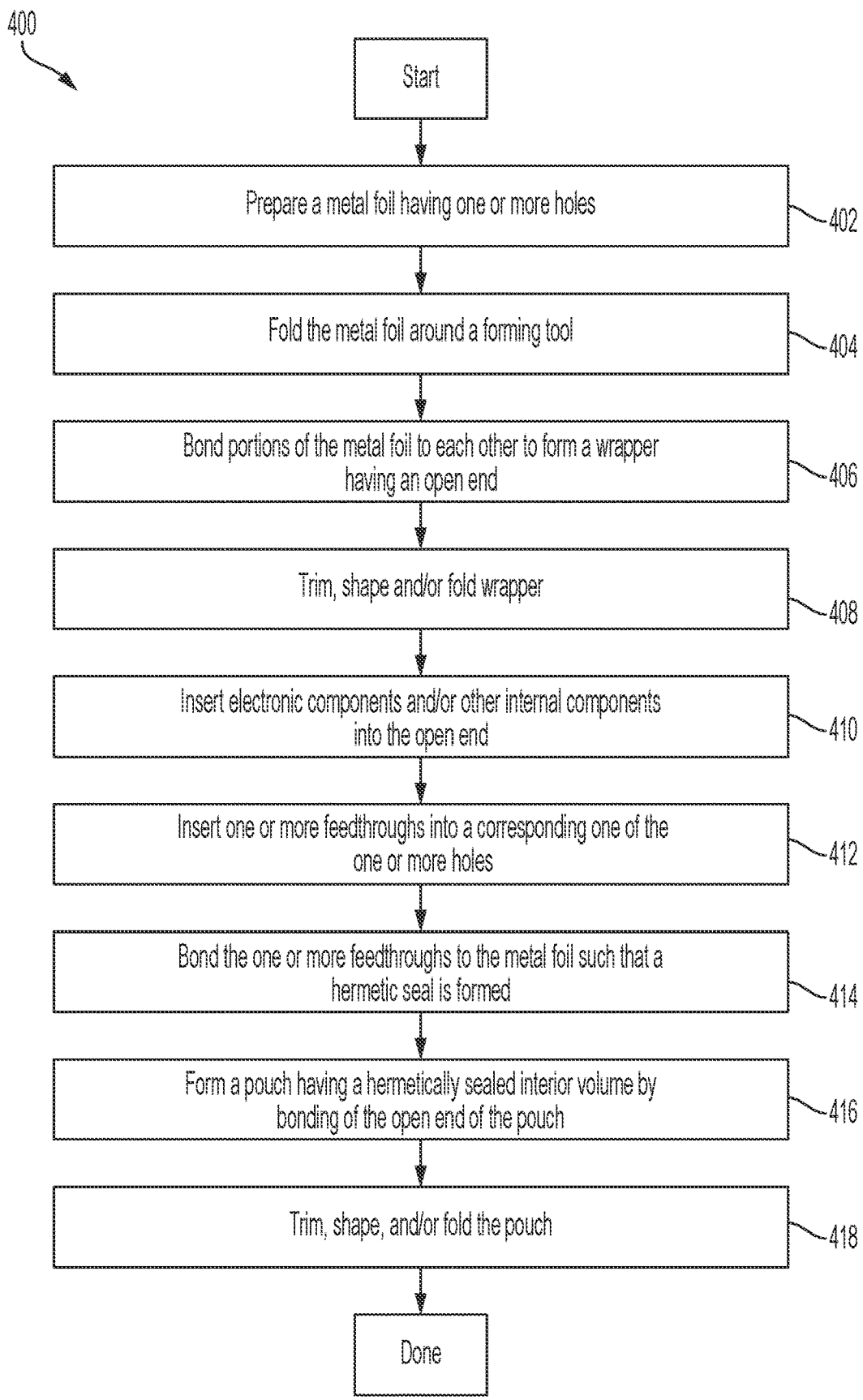
FIG. 4 is a flow chart illustrating a method of preparing a pouch enclosing internal components according to one or more embodiments of the present disclosure.

FIG. 3A is a perspective view illustrating a metal foil and internal components according to one or more embodiments of the present disclosure. FIG. 4 is a flow chart illustrating a method of preparing a pouch enclosing internal components according to one or more embodiments of the present disclosure.

With reference to FIGS. 3A and 4, the method (400) of preparing a pouch 120 in accordance with one or more embodiments of the present disclosure includes preparing a metal foil 102 having one or more holes 104 (402). The preparation of the metal foil 102 having the one or more holes 104 may be the same as or similar to act 202 described with respect to FIG. 2. Accordingly, a duplicative description thereof will not be repeated.

In one or more embodiments, the method (400) of preparing a pouch 120 in accordance with one or more embodiments of the present disclosure includes folding the metal foil 102 around a forming tool (404). The forming tool may have the approximate or expected shape of the electronic components 108 and/or other internal components (e.g., the battery 110). However, the present disclosure is not limited thereto. For example, the forming tool may be utilized to set any desired or suitable shape for the metal foil 102. Accordingly, the metal foil 102 may have a profile or shape based on the forming tool when the forming tool is first removed.

As shown in FIGS. 3A and 4, the method (400) of preparing a pouch 120 in accordance with one or more embodiments of the present disclosure includes bonding portions of the metal foil 102 to each other to form a wrapper 124 having an open end 122 (406). For example, a wrapper 124 (e.g., a preformed wrapper) may have a first end 126 and a second end 128 formed by bonding (e.g., energetically bonding) edges and/or sides of the metal foil 102 together. The first end 126 and the second end 128 may be opposite to each other with an interior volume of the wrapper 124 therebetween.

In one or more embodiments, the open end 122 of the wrapper 124 may have a suitable size and shape for receiving the electronic components 108, other internal components, and/or a dry inert gas prior to final bonding (e.g., final welding). However, the present disclosure is not limited thereto.

Although a single large sized open end is depicted in FIG. 3A, the present disclosure is not limited thereto. For example, the wrapper 124 may have multiple large sized open ends for receipt of electronic components 108 and/or other internal components with suitable changes to the method (400) of sealing (e.g., bonding) the wrapper 124 as will be described in more detail below.

By forming the wrapper 124 utilizing a metal foil 102 prior to insertion of the electronic components 108 and/or other internal components, the wrapper 124 may be more easily formed into a desired or suitable shape accommodating a range of potential electronic components 108 and/or other internal components. For example, the wrapper 124 may be produced in a high volume manufacturing facility in an automated fashion and provided to another for trimming, shaping, and/or welding. However, the present disclosure is not limited thereto. For example, the entire process of preparing a pouch according to one or more embodiments of the present disclosure may be performed at one facility or a plurality of facilities with one or more manual, semi-automated, and/or fully automated processes.

Therefore, as shown in FIG. 4, the method (400) of preparing a pouch 120 in accordance with one or more embodiments of the present disclosure includes trimming, shaping, and/or folding the wrapper 124 (408). In this case, the wrapper 124 may be further trimmed, shaped, and/or welded prior to insertion of electronic components 108 and/or other internal components.

Figure 3B:
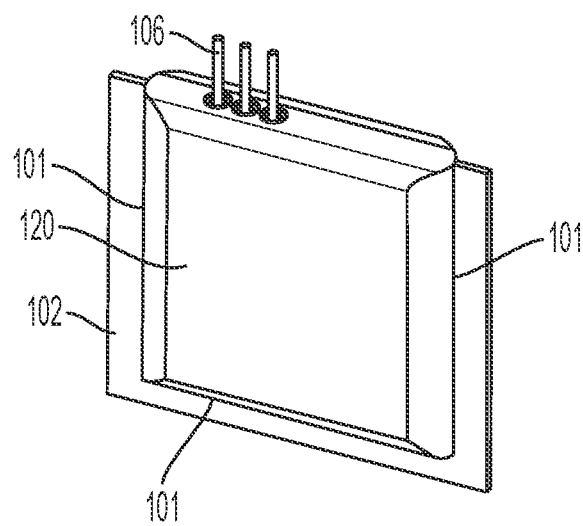
FIG. 3B is a perspective view illustrating a pouch bonded to feedthroughs and enclosing internal components according to one or more embodiments of the present disclosure.

FIG. 3B is a perspective view illustrating a pouch bonded to feedthroughs and enclosing internal components according to one or more embodiments of the present disclosure.

With reference to FIGS. 3B and 4, the method (400) of preparing a pouch 120 in accordance with one or more embodiments of the present disclosure includes inserting electronic components 108 and/or other internal components (e.g., the battery 110) into the open end 122 (410), inserting one or more feedthroughs 106 into a corresponding one of the one or more holes 104 (412), and bonding the one or more feedthroughs 106 to the metal foil 102 such that a hermetic seal is formed (414). The insertion of one or more feedthroughs 106 into a corresponding one of the one or more holes 104 (412) and the bonding of the one or more feedthroughs 106 to the metal foil 102 such that a hermetic seal is formed (414) may be the same as or similar to acts 202 and 206 described with respect to FIG. 2. Accordingly, a duplicative description thereof will not be repeated.

In one or more embodiments, the forming of a pouch 120 having a hermetically sealed interior volume by bonding of the open end 122 of the pouch 120 (416) includes sealing (e.g., bonding) the open end 122 of the pouch. The open end 122 may be hermetically sealed by energetically bonding (e.g., thermal bonding such as laser welding or resistance welding, ultrasonic bonding, and/or the like) along a seam to close the open end 122.

Figure 3C:
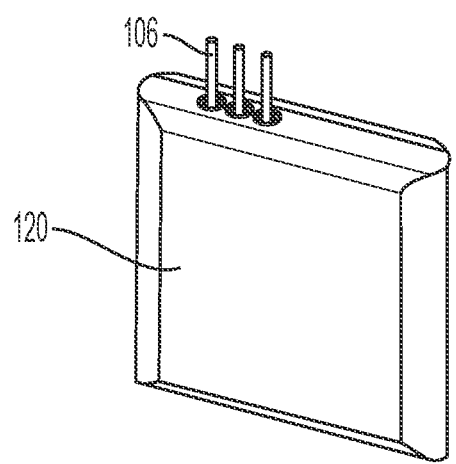
FIG. 3C is a perspective view illustrating a pouch bonded to feedthroughs and enclosing internal components according to one or more embodiments of the present disclosure.

FIG. 3C is a perspective view illustrating a pouch bonded to feedthroughs and enclosing internal components according to one or more embodiments of the present disclosure.

With reference to FIGS. 3C and 4, the method (400) of preparing a pouch 120 in accordance with one or more embodiments of the present disclosure includes trimming, shaping, and/or folding of the pouch 120 (418). The trimming, shaping, and/or folding of the pouch 120 (418) may be the same as or similar to act 212 described with respect to FIG. 2. Accordingly, a duplicative description thereof will not be repeated.

Figure 5:
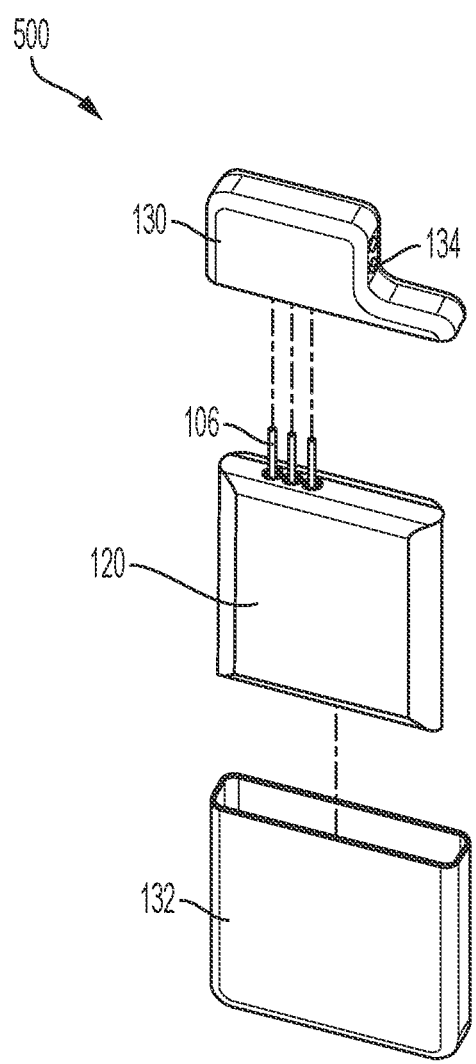
FIG. 5 is an exploded perspective view of a medical device according to one or more embodiments of the present disclosure.

FIG. 5 is an exploded perspective view of a medical device according to one or more embodiments of the present disclosure.

With reference to FIG. 5, a medical device (e.g., an implantable pulse generator) 500 includes a case (e.g., an outer case) including a header (e.g., a pre-molded header) 130 and a case bottom (e.g., a molded case bottom) 132 bonded or coupled to the header 130. For example, the header may be directly cast on to an upper surface or rim of the case bottom 132. The case may include polyetheretherketone (PEEK), polysulfone, liquid crystal polymer (LCP), and/or polyurethane. However, the present disclosure is not limited thereto. For example, any other biocompatible, biostable, and moldable polymer may be utilized.

In one or more embodiments, the medical device 500 includes a pouch 120 providing a hermetically sealed interior volume for electronic components 108 and/or other internal components (e.g., the battery 110). In the case of an implantable pulse generator, the electronic components 108 and/or the battery 110 may generate electrical pulses to be transmitted to an area outside the medical device 500. For example, stimulation via electrical pulses may be transmitted to nerves, muscles, and/or any other suitable location of a patient to provide beneficial effects.

To provide a pathway for therapeutic stimulation, the header 130 may connect the conductive pins of feedthroughs 106 to leads containing a plurality of wires and/or electrodes, and stimulating pulses (e.g., electrical pulses) may be delivered to outside the medical device 500 via one or more holes 134 extending through a side of the header 130. The conductive pins of the feedthroughs 106 and other electrical connections may be encapsulated by an epoxy, silicone rubber, and/or the like to isolate the conductors from each other. However, the present disclosure is not limited thereto.

Figure 6:
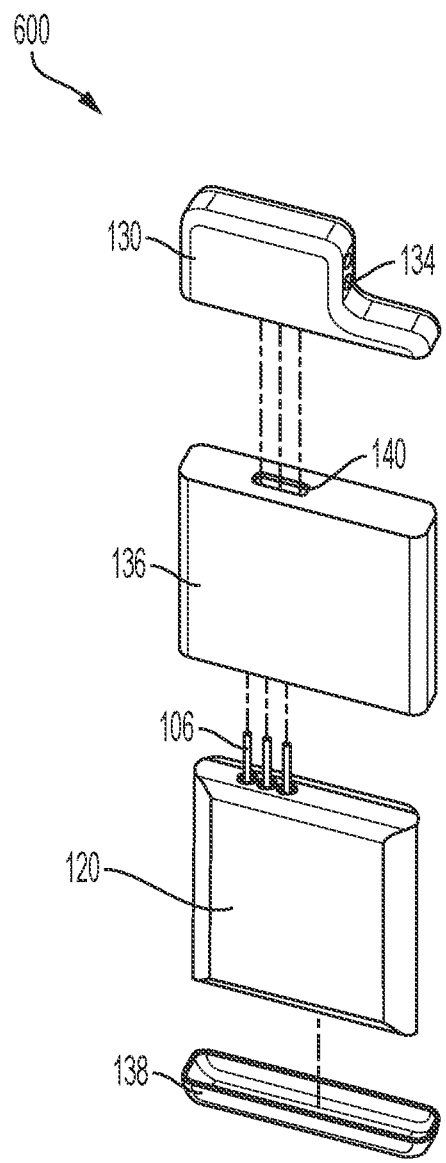
FIG. 6 is an exploded perspective view of a medical device according to one or more embodiments of the present disclosure.

FIG. 6 is an exploded perspective view of a medical device according to one or more embodiments of the present disclosure.

With reference to FIG. 6, a medical device (e.g., an implantable pulse generator) 600 includes a case (e.g., an outer case) including a header (e.g., a pre-molded header) 130, a body 136 bonded or coupled to the header 130, and a cap (e.g., an end cap) 138 bonded or coupled to the body 136. In one or more embodiments, the header may be directly cast on to an upper surface or rim of the body 136.

In one or more embodiments, the medical device 500 includes a pouch 120 inside the body 136 of the medical device 500 and providing a hermetically sealed interior volume for electronic components 108 and/or other internal components (e.g., the battery 110). In the case of an implantable pulse generator, the electronic components 108 and/or the battery 110 may generate electrical pulses to be transmitted to an area outside the medical device 500. For example, stimulation via electrical pulses may be transmitted to nerves, muscles, and/or any other suitable location of a patient to provide beneficial effects.

The body 136 of the case may have an opening (e.g., a slot) 140 extending through and defined in an upper surface of the body 136 for receiving one or more conductive pins of feedthroughs 106. For example, one or more conductive pins of feedthroughs 106 may extend through the opening 140 to be connected to leads containing a plurality of wires and/or electrodes in the header 130. To electrically isolate conductors in the header 130 from each other, an adhesive such as epoxy, silicone rubber, and/or the like may be utilized to encapsulate the conductive pins of feedthrough 106 and other electrical connections. However, the present disclosure is not limited thereto.

The cap 138 may be attached to the body 136 utilizing any suitable robust, simple and fast method such as snap fit components, ultrasonic welding, ultraviolet (UV) cured adhesive, fasteners, and/or the like. In this case, the interior volume of the body 136 outside the pouch 120 may not be hermetically sealed. However, because the pouch 120 has a hermetically sealed interior volume protecting the electronic components 108 and/or other internal components, a non-hermetic seal at the body 136 is allowable. For example, in one or more embodiments, the pouch 120 (e.g., the metal foil 102 of the pouch 120) may separate the hermetically sealed interior volume from the interior volume of the body 136 that is not hermetically sealed. In one or more embodiments, the cap 138 may include a polymer (e.g., a molded polymer) and/or a metal (e.g., a machined/formed metal).

Although the cap 138 may be attached utilizing a simple and fast method such as snap fit components, ultrasonic welding, ultraviolet (UV) cured adhesive, fasteners, and/or the like, and the body 136 of the case may not be hermetically sealed, the present disclosure is not limited thereto. For example, the cap 138 may be attached to the body 136 utilizing any suitable method and the body 136 in addition to components coupled or bonded thereto may be suitably changed to form a hermetic seal at the body 136 in accordance with one or more embodiments of the present disclosure.

Generally, any component of the case may include PEEK, polysulfone, liquid crystal polymer (LCP), epoxy (e.g., pre-cast epoxy), and/or polyurethane. However, the present disclosure is not limited thereto. For example, any other biocompatible, biostable, rigid, and moldable polymer may be utilized and, in the case of the cap 138, a metal may be utilized.

Figure 7:
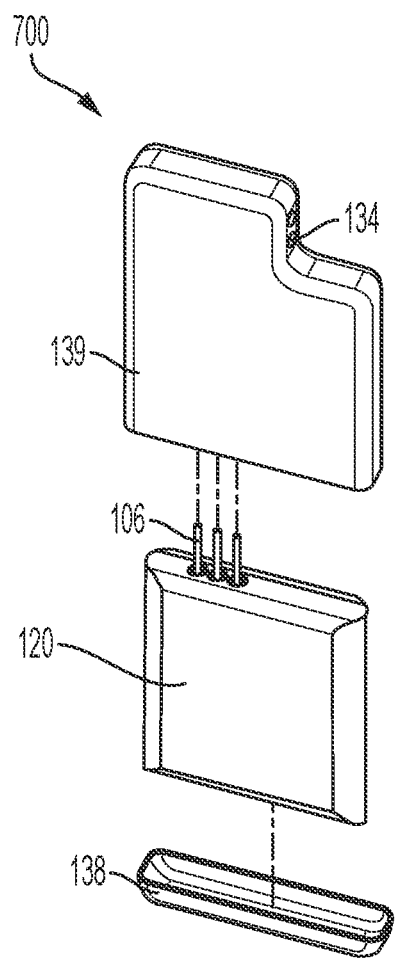
FIG. 7 is an exploded perspective view of a medical device according to one or more embodiments of the present disclosure.

FIG. 7 is an exploded perspective view of a medical device according to one or more embodiments of the present disclosure.

With reference to FIG. 7, a medical device (e.g., an implantable pulse generator) 700 includes a case (e.g., an outer case) including an upper case (e.g., a molded upper case) 139 and a cap (e.g., an end cap) 138 bonded or coupled to the upper case 139. The upper case 139 may include header components for the medical device 700.

For example, the upper case 139 may be insert molded with header components including lead connector assemblies and connectors to be connected to the conductive pins of the feedthroughs 106. In this case, when the pouch 120 is inserted into the upper case 139, the conductive pins of the feedthroughs 106 may be pushed into corresponding connectors (e.g., female connectors) to create the desired or suitable electrical connections (e.g., desired or suitable electrical connections for an implantable pulse generator). To ensure isolation of the conductors, an adhesive such as epoxy or silicone rubber may be applied to encapsulate the feedthrough pins and connections. However, the present disclosure is not limited thereto.

In one or more embodiments, the cap 138 may be joined, attached, or coupled to the upper case 139 utilizing a rapid, inexpensive technique such as press fit components, ultrasonic welding, solvent bonding, and/or the like. Because the pouch 120 has a hermetically sealed interior volume protecting the electronic components 108 and/or other internal components, a non-hermetic seal within the upper case 139 is allowable. However, the present disclosure is not limited to the described cap 138 mechanisms for connecting to the upper case 139. For example, any suitable changes may be made to the upper case 139 and the cap 138 to form a hermetically sealed interior volume.

Figure 8:
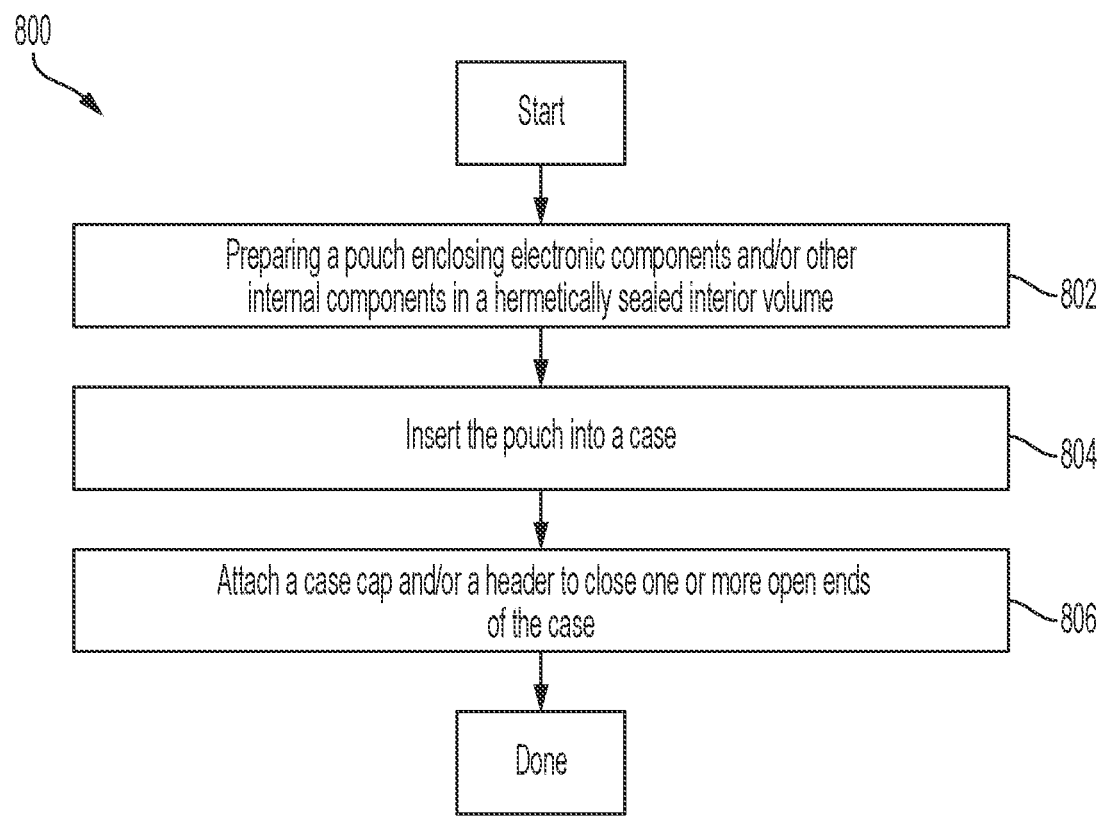
FIG. 8 is a flow chart illustrating a method of manufacturing a medical device according to one or more embodiments of the present disclosure.

FIG. 8 is a flow chart illustrating a method of manufacturing a medical device according to one or more embodiments of the present disclosure.

With reference to FIG. 8, a method (800) of manufacturing a medical device 500, 600, or 700 according to one or more embodiments of the present disclosure includes preparing a pouch 120 enclosing electronic components 108 and/or other internal components in a hermetically sealed interior volume (802). The method of preparing the pouch 120 enclosing electronic components 108 and/or other internal components in the hermetically sealed interior volume (802) may be the same as or similar to method 200 or 400 described with respect to FIG. 2 or 4. Accordingly, a duplicative description thereof will not be repeated.

The method may include inserting the pouch 120 into a case (804). For example, the pouch 120 may be inserted into the case bottom 132 shown in FIG. 5, the body 136 shown in FIG. 6, or the upper case 139 shown in FIG. 7. After inserting the pouch 120 into the case, the method may include attaching a cap 138 and/or a header 130 to close one or more open ends of the case. In this case, a non-hermetic seal may be allowable such that the case may not have a hermetically sealed interior volume because the pouch 120 has a hermetically sealed interior volume to protect electronic components 108 and/or other internal components.

Accordingly, in one or more embodiments, the case may be an outer case formed of a strong and rigid molded polymer component to form a protective cover or shell around the pouch 120. The case may initially have one or both ends open to receive the pouch 120 prior to being completed by attaching a header and/or a cap.

In one or more embodiments, the case may be opaque so that the inner components are not visible and smooth to minimize or reduce tissue damage. However, the present disclosure is not limited thereto. For example, the case may be transparent or translucent. In one or more embodiments, pigments and/or colorants may be introduced to change the color of the case.

Regardless of the assembly or design shown and described with reference to FIGS. 5-8, the utilization of a molded case provides significant opportunity in terms of device shape and molded-in features. For example, the case (e.g., the outer case) may have any desired or selected shape to conform (e.g., bend) to anatomic structures (e.g., curved anatomic structures such as skull, ribs, vessels, and/or the like) of a patient. In contrast, related art titanium cases may not be able to support fine details such as suture holes or very tight radii due to fabrication limitations. In other words, the limitations of related art titanium cases may not be present with the polymer cases utilized in accordance with one or more embodiments of the present disclosure. Further, although a polymer case may lack a hermetically sealed interior volume, the pouch 120 provides a hermetically sealed interior volume for sensitive electronic components.

In one or more embodiments, internal case features may be included to assist in the fitting of the pouch 120. For example, features may be molded onto the case to facilitate engagement with a cast on or pre-molded header. In one or more embodiments, an antenna and/or one or more charging coils may be provided by insert molding of the antenna and/or the one or more charging coils in the case.

Although a case such as a rigid molded polymer case is described and shown with respect to FIGS. 5-8, the present disclosure is not limited thereto. For example, the use of the pouch 120 having a hermetically sealed interior volume may enable a case formed by methods other than injection molding such as, for example, dip coating, spray coating, casting, and/or the like. In this case, the case may be formed of a coating including one or more layers applied to the pouch 120.

In one or more embodiments, the case may be flexible or rigid depending on the materials utilized for the coating including one or more layers. By applying one or more layers including flexible materials to form a flexible case, the flexibility of the pouch 120 may be utilized in combination with the flexible case to form a flexible medical device in accordance with one or more embodiments of the present disclosure.

Figure 9A:
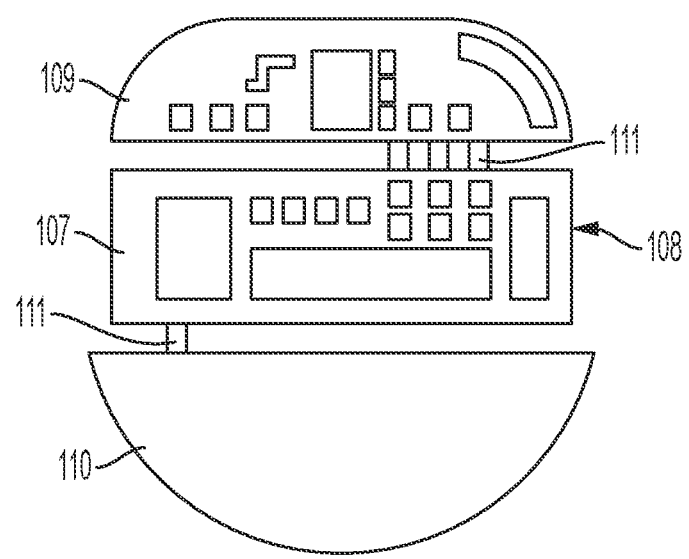
FIG. 9A is a plan view illustrating internal components to be enclosed in a pouch of a flexible medical device according to one or more embodiments of the present disclosure.

FIG. 9A is a plan view illustrating internal components to be enclosed in a pouch of a flexible medical device according to one or more embodiments of the present disclosure.

With reference to FIG. 9A, a flexible medical device (e.g., an implantable pulse generator) includes internal components such as electronic components 108 including a first printed circuit board 107 and a second printed circuit board 109, and a battery 110 connected to the electronic components 108. In one or more embodiments, the first printed circuit board 107, the second printed circuit board 109, and the battery 110 may not be adapted to withstand flexing of the flexible medical device. In this case, the battery 110, the first printed circuit board 107, and/or the second printed circuit board 109 may be connected to each other by flexible circuitry (e.g., flexible connectors and/or cables) 111. As such, the internal components may be folded or bent at regions between the first printed circuit board 107, the second printed circuit board 109, and the battery 110 without damaging the internal components of the flexible medical device.

Although the battery 110, the first printed circuit board 107, and the second printed circuit board 109 are described as being rigid and unable to withstand flexing of a flexible medical device, the present disclosure is not limited thereto. For example, one or more of these components may be modified to be flexible or withstand forces applied by flexing of the flexible medical device.

Figure 9B:
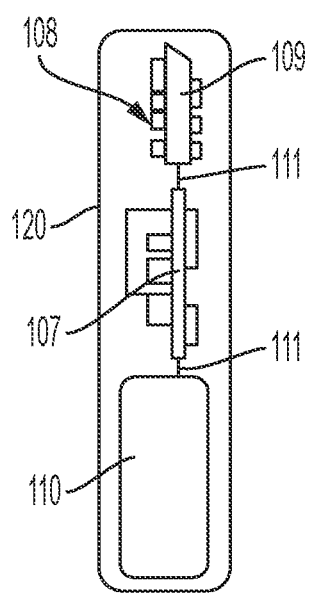
FIG. 9B is a cross-sectional view illustrating a pouch enclosing internal components according to one or more embodiments of the present disclosure.
Figure 10:
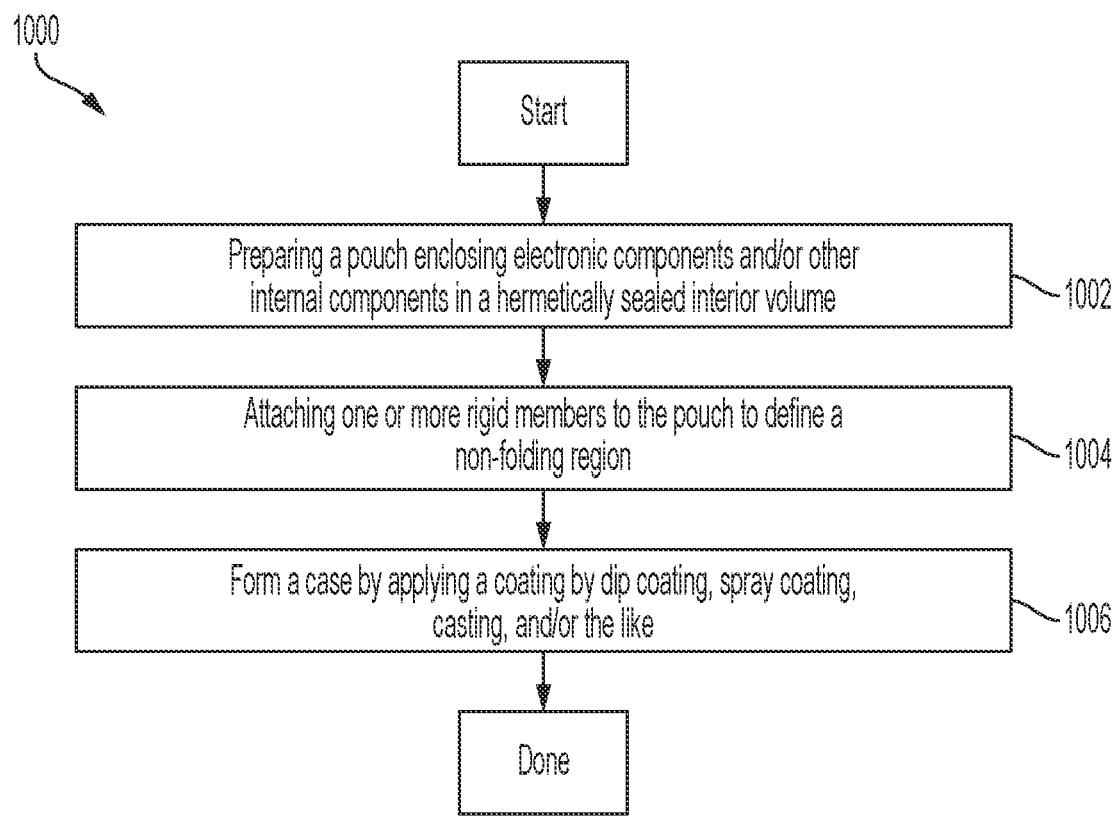
FIG. 10 is a flow chart illustrating a method of manufacturing a flexible medical device according to one or more embodiments of the present disclosure.

FIG. 9B is a cross-sectional view illustrating a pouch enclosing internal components according to one or more embodiments of the present disclosure. FIG. 10 is a flow chart illustrating a method of manufacturing a flexible medical device according to one or more embodiments of the present disclosure.

With reference to FIGS. 9B and 10, a method (1000) of manufacturing a flexible medical device 900 according to one or more embodiments of the present disclosure includes preparing a pouch 120 enclosing electronic components 108 and/or other internal components (e.g., a battery 110) in a hermetically sealed interior volume (1002). The method of preparing the pouch 120 enclosing electronic components 108 and/or other internal components in the hermetically sealed interior volume (1002) may be the same as or similar to method 200 or 400 described with respect to FIG. 2 or 4. Accordingly, a duplicative description thereof will not be repeated.

For example, in one or more embodiments, the process of preparing the pouch 120 may include wrapping a metal foil 102 around one or more frames around (e.g., surrounding) the electronic components 108, a portion of the electronic components 108, and/or the battery 110. The one or more frames may be between the pouch 120 and internal components of the pouch 120 such as the electronic components 108, a portion of the electronic components 108, and/or the battery 110 to define non-flexing regions (or rigid regions) of the flexible medical device 900. Accordingly, regions reinforced with the one or more frames may ensure that flex-sensitive components are not damaged by flexing of the flexible medical device or other mechanical forces in vivo. In one or more embodiments, the one or more frames may be coupled to the pouch 120 and/or the electronic components 108. In one or more embodiments, the one or more frames may also define flexible regions corresponding to the location of the flexible circuitry 111 by exposing (e.g., not surrounding) the flexible circuitry 111.

Although one or more frames may be utilized to define non-flexing regions (or rigid regions) 115 and/or flexible regions 117 of a flexible medical device 900, the present disclosure is not limited thereto.

Figure 9C:
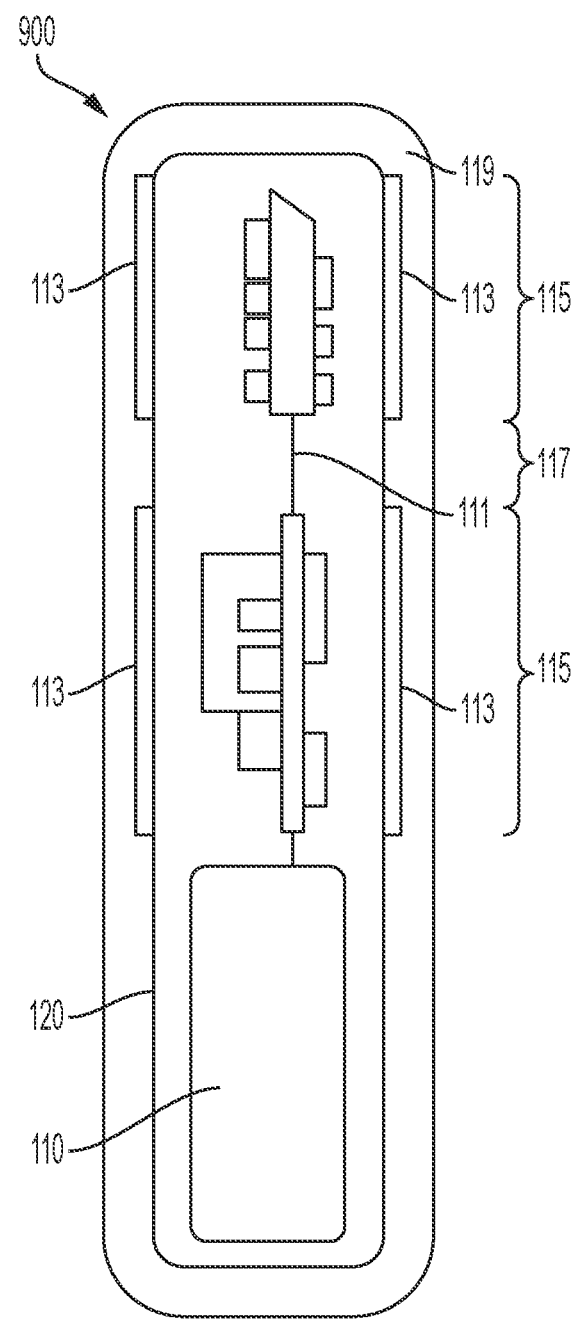
FIG. 9C is a cross-sectional view illustrating a flexible medical device according to one or more embodiments of the present disclosure.

FIG. 9C is a cross-sectional view illustrating a flexible medical device according to one or more embodiments of the present disclosure.

As shown in FIGS. 9C and 10, a method (1000) of manufacturing a flexible medical device 900 according to one or more embodiments of the present disclosure includes attaching one or more rigid members 113 to the pouch 120 to define a non-flexing region 115 (1004). The one or more rigid members 113 may be made of any suitable material having sufficient stiffness such as PEEK and/or the like. The one or more rigid members 113 may be attached to the pouch 120 of the flexible medical device 900 utilizing one or more suitable attachment mechanisms such as an adhesive, a dip coating, a spray coating, and/or the like. In one or more embodiments, the rigid members 113 may not be attached to the pouch 120, but may be placed internal or external to the pouch, or connected to electronic components 108 in the pouch 120.

For example, a rigid member 113 (e.g., a rigid member 113 having a planar shape) may be attached to an outer surface of the pouch 120 utilizing an adhesive. As shown in FIG. 9, four rigid members 113 may be attached by adhesive to the outer surface of the pouch 120. However, the present disclosure is not limited thereto. For example, any specific number, shape, and/or method of attaching the rigid member 113 to the outer surface of the pouch 120 may be utilized.

For example, in the case of dip coating, the pouch may be dipped in a controlled or selected manner to position the dip coating to form one or more rigid members 113 on the pouch 120. The dip coating may apply a coating having suitable thickness and/or stiffness to form the one or more rigid members 113 defining the non-flexing region 115.

In the case of spray coating, the solvent-based polymers and suitable epoxies may be sprayed directly onto the pouch 120 to form the one or more rigid members 113. The spray may be applied multiple times utilizing any suitable method to build up a rigid member 113 having a suitable thickness.

Accordingly, several different methods of forming one or more rigid members 113 may be utilized, alone or in combination, in accordance with one or more embodiments of the present disclosure.

As such, a flexible medical device 900 according to one or more embodiments of the present disclosure includes one or more rigid members 113 that are on (e.g., attached to) the pouch 120 to define one or more non-flexing regions 115. In one or more embodiments, as shown in FIG. 9C, a pair of rigid members 113 may be attached to opposing sides at an outer surface of the pouch 120 to define a non-flexing region 115 between the pair of the plurality of rigid members 113. However, the present disclosure is not limited thereto. For example, instead of a pair of rigid members 113, a single rigid member may wrap around a perimeter of a portion of the outer surface of the pouch 120 to define the non-flexing region 115.

Further, in one or more embodiments, one or more rigid members 113 may be inside the pouch 120 (e.g., attached to an inner surface of the pouch 120) to define a non-flexing region 115 within the pouch 120. However, in the case of applying one or more rigid members 113 inside the pouch, the rigid members 113 should be attached to the metal foil 102 prior to forming the pouch 120 having a hermetically sealed interior volume.

As shown in FIG. 9C, internal components that are not designed to withstand flexing such as the first printed circuit board 107 and the second printed circuit board 109 may be in the non-flexing regions 115 defined by the rigid members 113. The flexible regions 117 exposed or not covered by the plurality of rigid members 113 may correspond to the positions of the flexible circuitry 111 and/or other components that may flex or be adapted to withstand flexing such as the battery 110 shown in FIG. 9C.

Although one or more rigid members 113 are shown and described with respect to FIGS. 9C and 10, the present disclosure is not limited thereto. For example, in one or more embodiments, the internal components of the flexible medical device 900 may be adapted to flex or withstand flex such that the entirety of the flexible medical device 900 may be flexed in any direction. In this case, one or more rigid members 113 may not be provided and a coating 119 formed of a flexible material may be applied to the entire outer surface of the pouch 120.

Figure 9D:
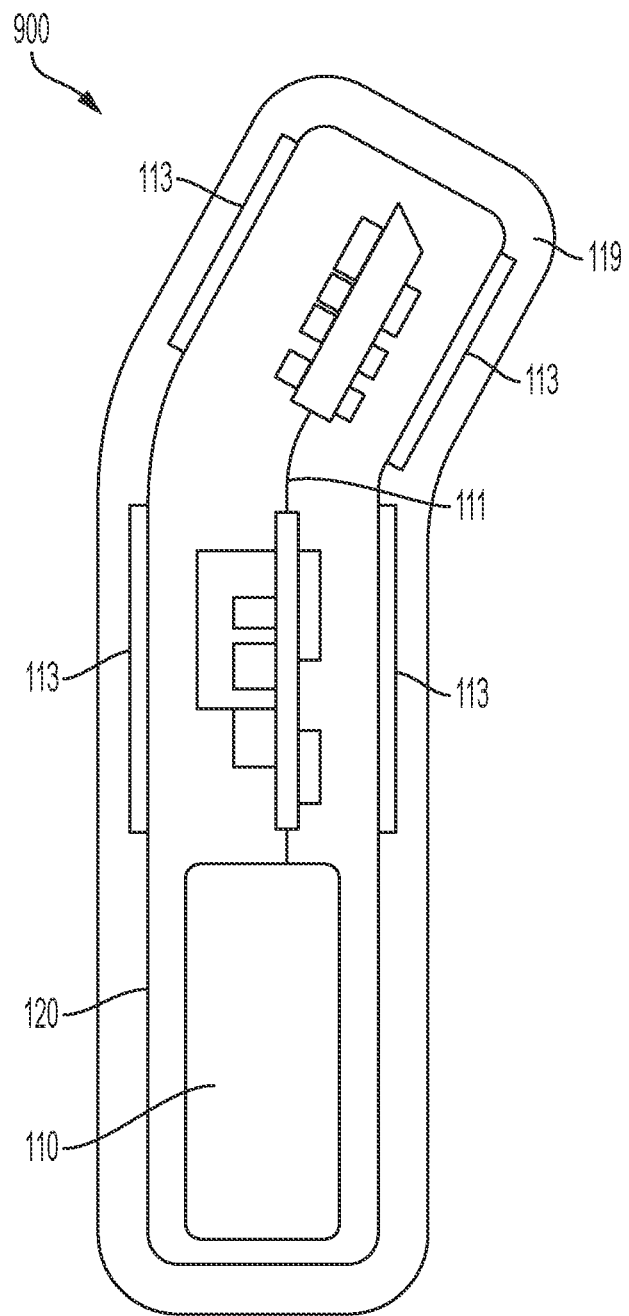
FIG. 9D is a cross-sectional view illustrating a flexible medical device in a flexed state according to one or more embodiments of the present disclosure.

FIG. 9D is a cross-sectional view illustrating a flexible medical device in a flexed state according to one or more embodiments of the present disclosure.

With reference to FIGS. 9C, 9D and 10, a method (1000) of manufacturing a flexible medical device 900 according to one or more embodiments of the present disclosure includes forming a case (e.g., a flexible case) by applying a coating 119 by dip coating, spray coating, casting, and/or the like (1006). In one or more embodiments, the coating 119 may be any suitable flexible coating such as silicone rubber and/or the like. However, the present disclosure is not limited thereto.

In the case of dip coating, rather than injection molding a case, a dip coating material may be applied directly to the pouch 120. The dip coating may be a polymer including two-part epoxies, OXPEKK-SC, or solvent-base polymers such as implant grade polyurethanes or polyimides. By controlling the solution viscosity and the dipping method utilizing any suitable method, a coating 119 of suitable thickness and surface finish may be formed over or around the pouch 120 as a flexible case.

In the case of spray coating, solvent-based polymers and suitable epoxies may be sprayed directly onto the pouch 120.

Multiple sprayed layers may be applied utilizing any suitable method to build up a coating 119 having a suitable thickness to provide mechanical protection for the pouch 120.

In the case of casting, a polymer shell may be cast in place around the pouch 120. A rigid or flexible mold sized to be larger than the pouch 120 may be utilized. As such, the pouch 120 may be secured inside the mold (e.g., at a center of the mold) and an uncured polymer may be poured and/or injected into a gap or space between the mold and the pouch 120. The uncured polymer may then be allowed to cure. Any suitable polymers for such a process may be utilized such as, for example, implant grade epoxies and/or the like. The casting process could incorporate the header 130 and connector areas as well, reducing the number of operations in accordance with one or more embodiments of the present disclosure.

Accordingly, several different methods of forming a case around the pouch 120 may be utilized in accordance with one or more embodiments of the present disclosure. These methods may be utilized alone or in combination with each other. For example, in one or more embodiments, a case may have a coating including multiple layers (e.g., multiple layers including different polymers) to achieve desired or suitable properties. For example, in one or more embodiments, a strong and rigid polymer base layer (e.g., OXPEKK-SC) may be overcoated with a soft silicone outer layer (e.g., silicone rubber) to reduce tissue trauma. As another example, a clear base coat may be applied to allow for visual inspection, and then be coated with an opaque outer coating for cosmetic reasons. As yet another example, a soft and flexible base coating covered by a rigid, tough outer layer may be provided for excellent or suitable shock resistance. As apparent from these examples, a multitude of options exist for coating the pouch 120 in one or more layers or coatings having varying properties. For example, the pouch 120 may include two or more layers including different materials selected from the following group: OXPEKK-SC, a polyurethane, polysulfone, PVC, polyethylene, PEEK, polycarbonate, Ultem PEI, polypropylene, a polyimide, and silicone rubber.

In one or more embodiments, different materials having different properties from each other may be utilized at a same layer as each other. For example, a portion of the case may be formed of OXPEKK-SC which has a high stiffness and another portion of the case of the case may be formed of silicone rubber which is flexible. As such, the case may have portions that are flexible and have other portions that are not flexible.

Accordingly, the flexible medical device may have localized rigid regions corresponding to the portions of the inner layer having regions formed of the material having the high stiffness.

In contrast to related art medical devices (e.g., related art medical devices utilizing titanium cans), the flexible medical device (e.g., the implantable pulse generator) 900 according to one or more embodiments of the present disclosure may enclose relatively large electronic components 108 and conform (e.g., bend) to curved anatomic structures of a patient. Some examples of such anatomic structures include a skull, ribs, vessels (e.g., large vessels), and/or the like. However, the present disclosure is not limited thereto.

Figure 11A:
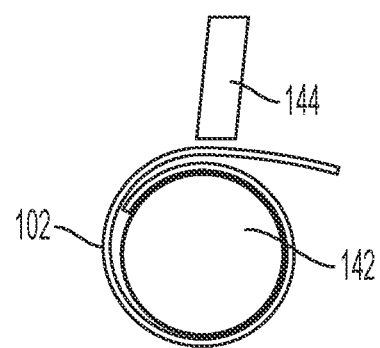
FIG. 11A is a side view illustrating an apparatus for forming a tube according to one or more embodiments of the present disclosure.
Figure 12:
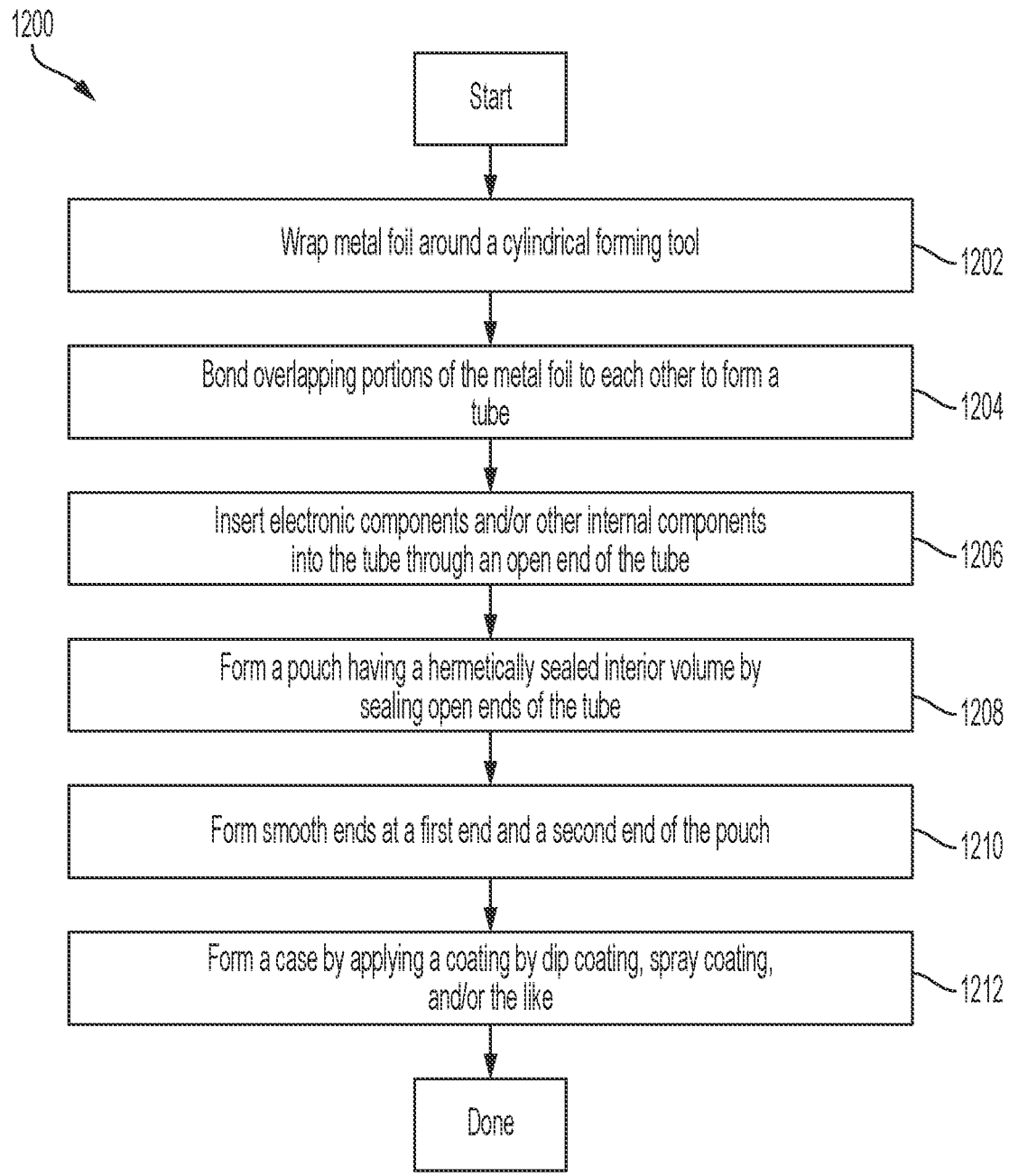
FIG. 12 is a flow chart illustrating a method of manufacturing a flexible cylindrical medical device according to one or more embodiments of the present disclosure.

FIG. 11A is a side view illustrating an apparatus for forming a tube according to one or more embodiments of the present disclosure. FIG. 12 is a flow chart illustrating a method of manufacturing a flexible cylindrical medical device according to one or more embodiments of the present disclosure.

With reference to FIGS. 11A and 12, a method (1200) of manufacturing a flexible cylindrical medical device according to one or more embodiments of the present disclosure includes wrapping a metal foil 102 around a cylindrical forming tool 142 (1202). The metal foil 102 may be wrapped around the cylindrical forming tool 142 such that the metal foil 102 has a cylindrical shape corresponding to the shape of the cylindrical forming tool 142, and portions (e.g., sides and/or edges) of the metal foil 102 may overlap and contact each other.

The method (1200) of manufacturing a flexible cylindrical medical device includes bonding (e.g., energetically bonding) the overlapping portions of the metal foil 102 to each other to form a tube 148 (1204). In one or more embodiments, the overlapping portions may be bonded to each other utilizing a linear or wheel electrode 144 and the cylindrical forming tool 142 as a welding counter electrode. In one or more embodiments, the forming tool 142 may be removed and the welding counter electrode may be separate and distinct from and formed of a different material than the cylindrical forming tool 142. Using the linear or wheel electrode 144 and the welding counter electrode, the overlapping portions of the metal foil 102 may be bonded to each other utilizing a single linear resistance weld or multiple parallel linear resistance welds to create a low profile lap weld. The cylindrical forming tool 142 may then be removed such that a tube 148 that is properly shaped to receive internal components remains.

Figure 11B:
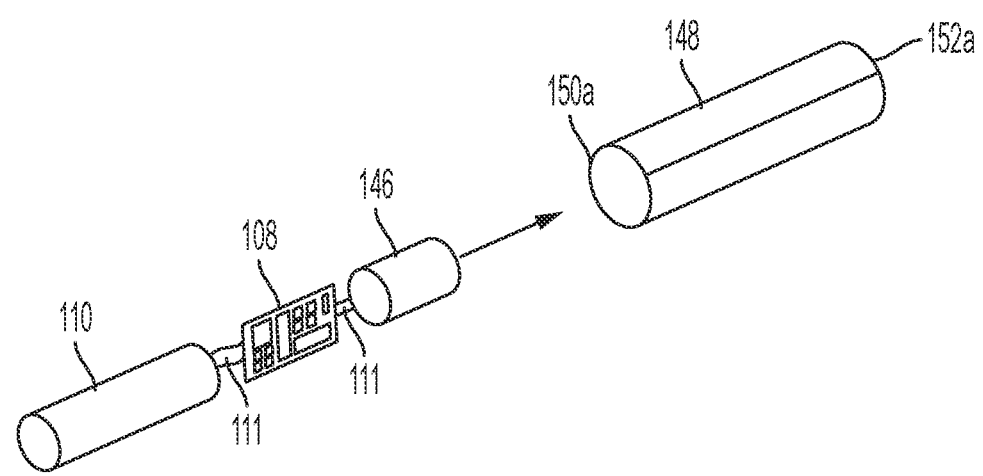
FIG. 11B is a perspective view illustrating internal components and a tube according to one or more embodiments of the present disclosure.

FIG. 11B is a perspective view illustrating internal components and a pouch according to one or more embodiments of the present disclosure.

With reference to FIGS. 11B and 12, the tube 148 may have open ends at a first end 150a (e.g., a bottom) of the tube 148 and a second end 152a (e.g., a top) of the tube 148 opposite to the first end 150a. As such, the method (1200) of manufacturing a flexible cylindrical medical device includes inserting electronic components 108, a battery 110, and/or other internal components (e.g., a capacitor 146) into the tube 148 through an open end (e.g., the first end 150a) of the tube 148 (1206). In this case, the electronic components 108 and other internal components (e.g., the battery 110 and the capacitor 146) are inside an interior volume of the tube 148 between the first end 150a and the second end 152a. The battery 110, the electronic components 108, and the capacitor 146 may be connected to each other by flexible circuitry 111.

In one or more embodiments, a protective film such polyetheretherketone (PEEK) or a polyimide film (e.g., Kapton®) may also be inserted into the tube 148 between other contents of the tube 148 and the metal foil 102 of the tube 148 to reduce the risk of metal foil damage.

Further, in one or more embodiments, an electrical insulator or electrically insulating film such as a polyimide may be provided between the metal foil 102 of the tube 148 and the electronic components 108. In this case, the electrical insulator or electrically insulating film may prevent an undesirable electrical connection from being formed between the metal foil 102 of the tube 148 and the electronic components 108.

Moreover, in one or more embodiments, one or more frames and/or one or more rigid members may also be provided inside or outside the tube 148 to define non-flexing regions and/or prevent undesirable electrical connections from being formed between the metal foil 102 of the tube 148 and the electronic components 108.

Figure 11C:
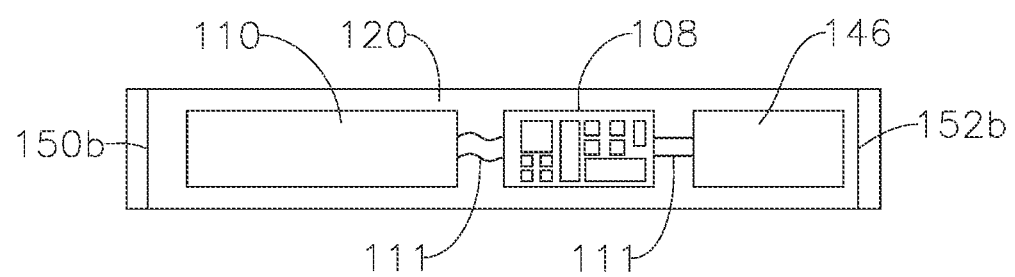
FIG. 11C is a plan view illustrating a pouch enclosing internal components according to one or more embodiments of the present disclosure.

FIG. 11C is a plan view illustrating a pouch enclosing internal components according to one or more embodiments of the present disclosure.

With reference to FIGS. 11B, 11C, and 12, the method (1200) of manufacturing a flexible cylindrical medical device includes forming a pouch 120 having a hermetically sealed interior volume by sealing (e.g., bonding) open ends of the tube 148 (1208). As shown in FIGS. 11B and 11C, the first end 150*a* and the second end 152*a* may be hermetically sealed by pinching the first end 150*a* and the second end 152*a* into a closed state and then bonding (e.g., energetically bonding) the pinched portions of the tube 148 at the first end 150*a* and the closed second end 152*a* together. For example, each of the first end 150*a* and the second end 152*a* may form a hermetic seal by welding the first end 150*a* and the second end 152*a* in a straight configuration.

Accordingly, a pouch 120 containing the electronic components 108, the battery 110, and the capacitor 146 in a hermetically sealed interior volume may be formed. In one or more embodiments, the pouch 120 may be further trimmed, shaped, and/or folded to ensure the pouch 120 fits inside a case of the flexible cylindrical medical device. For example, the pouch 120 may have a first end 150*b* and a second end 152*b* (e.g., a second end 152*b* opposite to the first end 150*b*) that are folded inwards toward a center of the pouch 120.

Although closing and welding the first end 150*a* and the second end 152*a* in a straight configuration is described and shown in FIG. 11C, any suitable method may be utilized to form a hermetically sealed interior volume. For example, in one or more embodiments, the first end 150*a* and the second end 152*a* of the tube 148 may not be pinched together. Rather, one or more sealing caps including titanium and/or stainless steel may fit over the open ends of the tube 148 at the first end 150*a* and the second end 152*a*. The one or more sealing caps may enclose the open ends of the tube 148 and be welded to the tube 148 to form a pouch 120 having a hermetically sealed interior volume. In this case, the one or more sealing caps may eliminate any need for trimming or shaping of the first end 150*a* and the second end 152*a* of the tube 148.

Figure 11D:
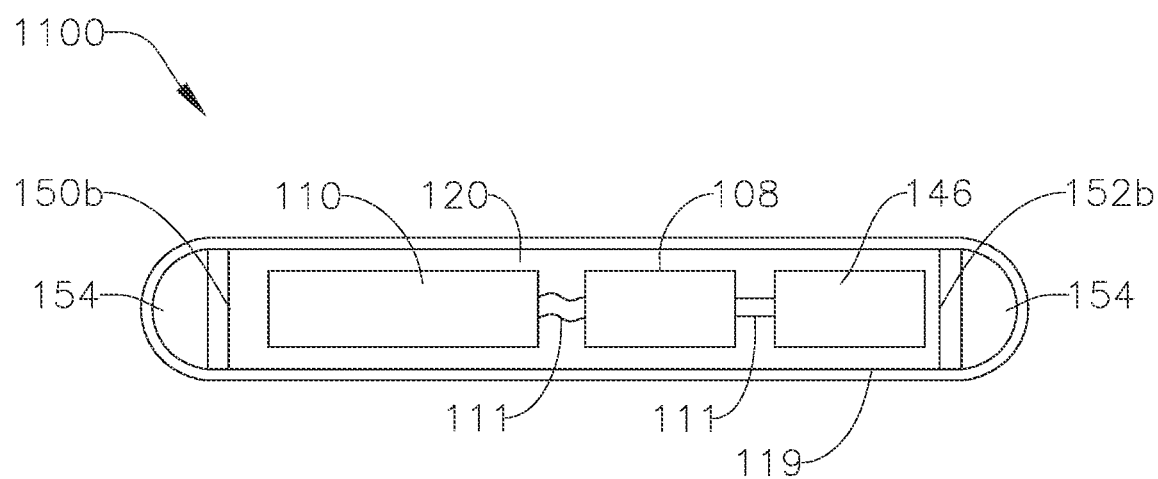
FIG. 11D is a plan view illustrating caps applied to a pouch according to one or more embodiments of the present disclosure.

FIG. 11D is a plan view illustrating caps applied to a pouch according to one or more embodiments of the present disclosure.

With reference to FIGS. 11D and 12, the method (1200) of manufacturing a flexible cylindrical medical device includes forming smooth ends at a first end 150*b* and a second end 152*b* of the pouch 120 (1210). Smooth ends may be formed utilizing one or more round caps 154, shaping the pouch 120, and/or applying a coating 119 by a controlled or selected dip method.

For example, in one or more embodiments, one or more round caps 154 may be applied or attached to the pouch 120 at (e.g., over) the first end 150*b* and/or the second end 152*b*. The one or more round caps 154 may be attached to the pouch 120 utilizing any suitable method and may include any suitable material such as titanium, stainless steel, silicone rubber, polyurethane, PEEK, polysulfone, polyetherimide, and/or the like.

The one or more round caps 154 may have a smooth outer surface that covers the sharp corners of the first end 102*b* and the second end 152*b* of the pouch 120. As such, sharp corners and/or edges of the pouch 120 may not be exposed. Further, in one or more embodiments, each of the first end 150*b* and the second end 152*b* between a corresponding one of the one or more round caps 154 and the interior volume of the pouch 120 may be folded inwards toward a center of the pouch 120 to reduce the exposure of sharp corners and/or edges and reduce a form factor of the pouch 120.

In one or more embodiments, the smooth ends may be formed at the first end 150*b* and/or the second end 152*b* by trimming and/or shaping the first end 150*b* and/or the second end 152*b* of the pouch 120. In this case, the one or more round caps 154 may not be provided.

In one or more embodiments, the smooth ends may be formed at the first end 150*b* and/or the second end 152*b* by applying a coating 119 utilizing a controlled or selected dip method at the first end 150*b* and/or the second end 152*b*. In this case, the coating 119 at the first end 150*b* and/or the second end 152*b* may be part of a larger coating 119 forming a case of the flexible cylindrical medical device 1100 as will described in more detail below. In this case, the one or more round caps 154 may not be provided.

FIG. 11E is a plan view illustrating a flexible cylindrical medical device according to one or more embodiments of the present disclosure.

With reference to FIGS. 11E and 12, the method (1200) of manufacturing a flexible cylindrical medical device 1100 includes forming a case by applying a coating 119 by dip coating, spray coating, and/or the like (1212). The forming a case by applying a coating 119 by dip coating, spray coating, and/or the like (1212) may be the same as or similar to act 1006 described with respect to FIG. 10. Accordingly, a duplicative description thereof will not be repeated.

In one or more embodiments, a pre-molded case similar to the case described with respect to FIGS. 5-7 may be applied alone or in combination with the coating 119. For example, the case may be an outer case formed of a strong and flexible molded polymer component to form a protective cover or shell around the pouch 120 and/or the coating 119. The pre-molded case (e.g., a pre-molded cylindrical case) may initially have one or both ends open to receive the pouch 120 that may or may not have the coating 119 prior to being completed by attaching a header and/or a cap to the open ends. However, the present disclosure is not limited thereto. For example, the case may be any suitable shape and the coating 119 may be applied around the pre-molded case.

As shown in FIG. 11E, because the pouch 120 is flexible and the coating 119 is a flexible coating (e.g., silicone rubber), the flexible cylindrical medical device 1100 may reversibly flex. The case of the flexible cylindrical medical device 1100 may be a polymeric tube with a round cap 154 bonded to one or both of the first end 150*b* and/or the second end 152*b*.

Figure 13A:
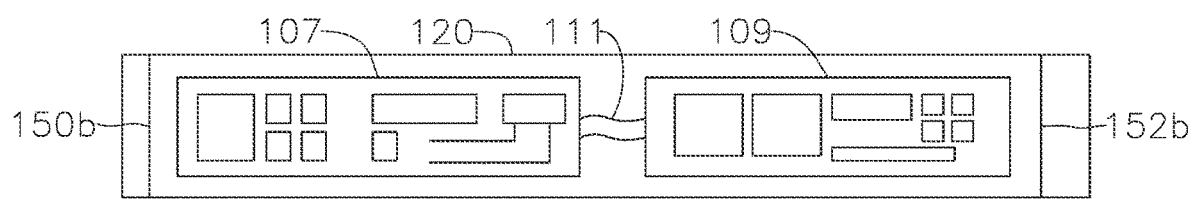
FIG. 13A is a plan view illustrating a pouch enclosing internal components according to one or more embodiments of the present disclosure.
Figure 13B:
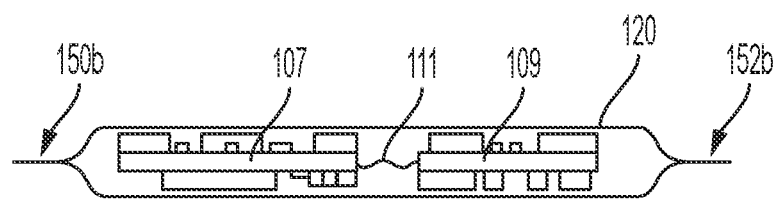
FIG. 13B is a side view illustrating a pouch enclosing internal components according to one or more embodiments of the present disclosure.
Figure 14:
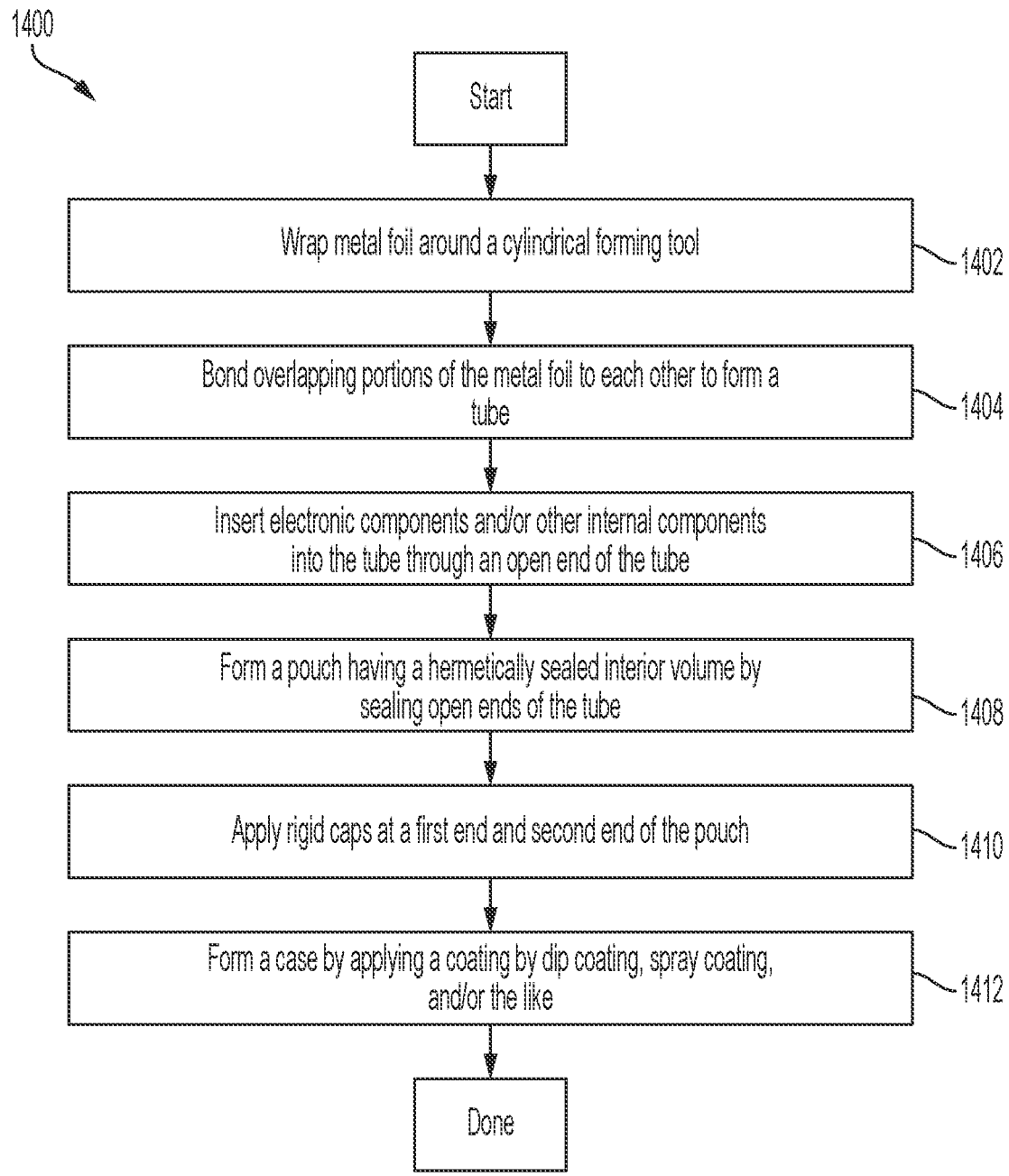
FIG. 14 is a flow chart illustrating a method of manufacturing a flexible cylindrical medical device according to one or more embodiments of the present disclosure.

FIG. 13A is a plan view illustrating a pouch enclosing internal components according to one or more embodiments of the present disclosure. FIG. 13B is a side view illustrating a pouch enclosing internal components according to one or more embodiments of the present disclosure. FIG. 14 is a flow chart illustrating a method of manufacturing a flexible cylindrical medical device according to one or more embodiments of the present disclosure.

With reference to FIGS. 13A, 13B, and 14, the method (1400) of manufacturing a flexible cylindrical medical device according to one or more embodiments of the present disclosure includes wrapping a metal foil 102 around a cylindrical forming tool (1402), bonding overlapping portions of the metal foil to each other to form a tube (1404), inserting electronic components and/or other internal components into the tube through an open end of the tube (1406), and forming a pouch having a hermetically sealed interior volume by sealing (e.g., bonding) open ends of the tube (1408). Acts 1402, 1404, 1406, and 1408 may be the same or substantially similar to acts 1202, 1204, 1206, and 1208 described with respect to FIG. 12. Accordingly, a duplicative description thereof will not be repeated.

As shown in FIGS. 13A and 13B, a flexible cylindrical medical device according to one or more embodiments of the present disclosure includes a pouch 120 containing electronic components such as a first printed circuit board 107 and a second printed circuit board 109 connected to each other via flexible circuitry 111. The pouch 120 may have a first end 150b and a second end 152b opposite to the first end 150b that is pinched and bonded to form a hermetically sealed interior volume inside the pouch 120.

Figure 13C:
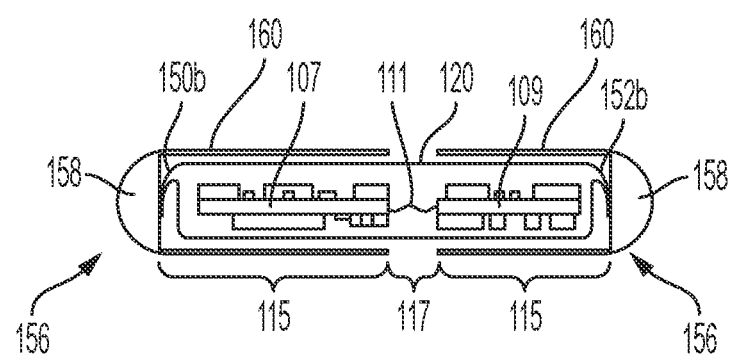
FIG. 13C is a side view illustrating rigid caps applied to a pouch according to one or more embodiments of the present disclosure.

FIG. 13C is a side view illustrating rigid caps applied to a pouch according to one or more embodiments of the present disclosure.

With reference to FIGS. 13C and 14, the method (1400) of manufacturing a flexible cylindrical medical device according to one or more embodiments of the present disclosure includes applying one or more rigid caps 156 at a first end 150b and a second end 152b of the pouch 120 (1410). The rigid caps 156 may be adhered to the first and second ends 150b, 152b of the pouch 120 or they may be attached via a friction fit. The one or more rigid caps 156 may each include an end 158 having a smooth outer surface and a shell (e.g., a protrusion) 160 extending from the end 158 toward a center of the pouch 120. The end 158 and the shell 160 may form a U-shape cross section as shown in FIG. 13C.

In one or more embodiments, the shell 160 may include a rigid or stiff material. In this case, as shown in FIG. 13C, the shell 160 may define a non-flexing region (or a rigid region) 115 in a volume of the shell 160 and a flexible region 117 (or flexible region) may be at regions that are exposed or not in the volume of the shell 160. Flex-sensitive components of the flexible cylindrical medical device may be in the non-flexing regions 115 defined by the shell 160.

Figure 13D:
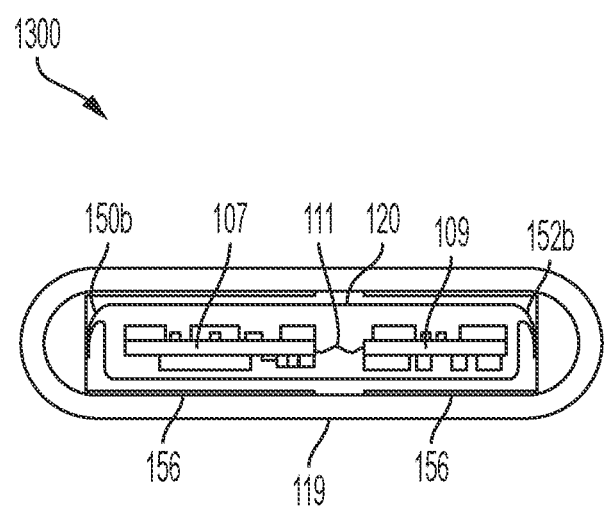
FIG. 13D is a side view illustrating a flexible cylindrical medical device according to one or more embodiments of the present disclosure.
Figure 13E:
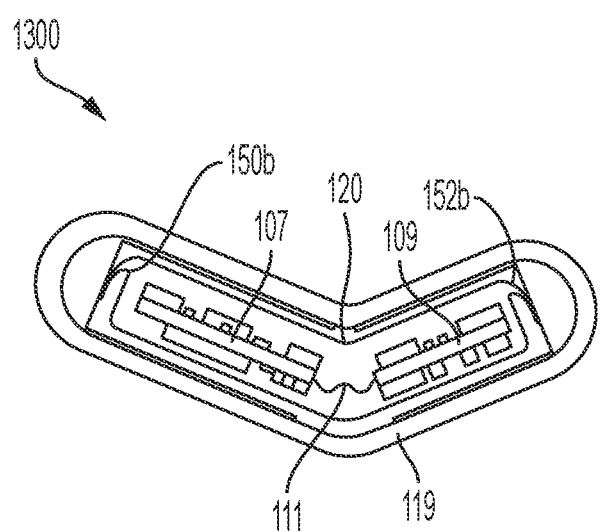
FIG. 13E is a side view illustrating a flexible cylindrical medical device in a flexed state according to one or more embodiments of the present disclosure.

FIG. 13D is a side view illustrating a flexible cylindrical medical device according to one or more embodiments of the present disclosure. FIG. 13E is a side view illustrating a flexible cylindrical medical device in a flexed state according to one or more embodiments of the present disclosure.

With reference to FIGS. 13D, 13E and 14, the method (1400) of manufacturing a flexible cylindrical medical device 1300 according to one or more embodiments of the present disclosure includes forming a case by applying a coating 119 by dip coating, spray coating, and/or the like (1412). The forming a case by applying a coating 119 by dip coating, spray coating, and/or the like (1412) may be the same as or similar to act 1212 described with respect to FIG. 12. Accordingly, a duplicative description thereof will not be repeated.

In one or more embodiments, a pre-molded case similar to the case described with respect to FIGS. 5-7 may be applied alone or in combination with the coating 119. For example, the case may be an outer case formed of a strong and flexible molded polymer component to form a protective cover or shell around the pouch 120 that may or may not have the coating 119. The pre-molded case (e.g., a pre-molded cylindrical case) may initially have one or both ends open to receive the pouch 120 that may or may not have the coating 119 prior to being completed by attaching a header and/or a cap to the open ends. However, the present disclosure is not limited thereto. For example, the case may be any suitable shape and the coating 119 may be applied around the pre-molded case.

As shown in FIG. 13E, because the pouch 120 is flexible and the coating 119 is a flexible coating (e.g., silicone rubber), the flexible cylindrical medical device 1300 may reversibly flex. The case of the flexible cylindrical medical device 1300 may be a polymeric tube with a round cap 154 bonded to one or both of the first end 150b and/or the second end 152b.

Accordingly, as disclosed herein, one or more embodiments of the present disclosure provide a system and method of preparing a hermetically sealed pouch from a metal foil. The pouch may be flexible and housed within a rigid or flexible outer casing. In accordance with one or more embodiments of the present disclosure, the pouch may be utilized to accommodate any suitable arrangement of electronic components and be utilized with a protective outer casing in any suitable medical device. In one or more embodiments, the pouch may be utilized in a rigid or flexible implantable medical device such as an implantable pulse generator, implantable myoelectric sensors, implantable pump, a pacemaker, and/or the like. The hermetically sealed pouch according to embodiments of the present disclosure may also be used to house a medical device including an auscultation sensor. The flexible, metal foil is thinner and would attenuate sound less than titanium or ceramic cases of the related art.

In the drawings, the relative flexibility and sizes of elements, layers, and regions may be exaggerated, contracted, and/or simplified for convenience of explanation. Further, because sizes and thicknesses of elements in the drawings are illustrated for convenience of explanation, the disclosure is not limited thereto. For example, the flexible medical devices illustrated in FIGS. 9D, 11E, and 13E depict a flexible medical device in a flexed state in a simplified manner without depicting the specific wrinkling, bowing, or displacement of the metal foil 102. In the case of FIGS. 9D, 11E, and 13E, when the flexible regions are bent sufficiently, the metal foil 102 inside of the bend will wrinkle, bow, or be displaced to a certain degree. As such, in one or more embodiments, a gap or an accommodating portion (e.g., an accommodating portion defining the gap) adjacent to the bend may be present to receive the movement/deformation of the metal foil 102. For example, a shape of the metal foil 102 may be changed by flexing the medical device and a portion of the metal foil 102 may be accommodated in the gap or the accommodating portion.

Further, spatially relative terms, such as "beneath," "below," "lower," "above," "upper," "bottom," "top," and the like, may be used herein for ease of description to describe one element or feature's relationship to (an)other element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

While various methods according to some embodiments of the present disclosure has been described according to various processes having a certain process order, the present disclosure is not limited thereto. For example, when a certain embodiment may be implemented differently, a specific process order may be different from the described order.

For example, two consecutively described processes may be performed at the same or substantially at the same time, or may be performed in an order opposite to the described order.

It will be understood that, although the terms "first," "second," "third," etc., may be utilized herein to describe various elements, components, regions, and/or sections, these elements, components, regions, and/or sections should not be limited by these terms. These terms are utilized to distinguish one element, component, region, layer or section from another element, component, region, or section. Thus, a first element, component, region, or section described could be termed a second element, component, region, or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology utilized herein is for the purpose of describing particular embodiments and is not intended to be limiting of the present disclosure. As utilized herein, the singular forms "a" and "an" are intended to include the plural forms as well, unless the context clearly indicates otherwise. It will be further understood that the terms "comprises," "comprising," "includes," "including," "has," "have," and "having," when utilized in this specification, specify the presence of the stated features, integers, steps, operations, elements, and/or components, but do not preclude the presence or addition of one or more other features, integers, steps, operations, elements, components, and/or groups thereof. As utilized herein, the term "and/or" includes any and all combinations of one or more of the associated listed items. For example, the expression "A and/or B" denotes A, B, or A and B.

As utilized herein, the term "substantially," "about," and similar terms are utilized as terms of approximation and not as terms of degree, and are intended to account for the inherent deviations in measured or calculated values that would be recognized by those of ordinary skill in the art. "About" or "approximately," as utilized herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The medical devices and/or components thereof according to embodiments of the present disclosure described herein may be implemented utilizing any suitable hardware, firmware, software, or a combination of software, firmware, and hardware. For example, the various components of the medical devices may be formed on one integrated circuit (IC) chip or on separate IC chips. Further, the various components of the medical devices may be implemented on a flexible printed circuit film, a tape carrier package (TCP), a printed circuit board (PCB), or formed on one substrate.

Unless otherwise defined, all terms (including technical and scientific terms) utilized herein have the same meaning as commonly understood by one of ordinary skill in the art to which the present disclosure belongs. It will be further understood that terms, such as those defined in commonly utilized dictionaries, should be interpreted as having a meaning that is consistent with their meaning in the context of the relevant art and/or the present specification, and should not be interpreted in an idealized or overly formal sense, unless expressly so defined herein.

Although some example embodiments have been described, those skilled in the art will readily appreciate that one or more suitable modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be utilized singly or in combination with features, characteristics, and/or elements described in connection with other embodiments unless otherwise specifically indicated. Therefore, it is to be understood that the foregoing is illustrative of one or more suitable example embodiments and is not to be construed as limited to the specific example embodiments disclosed herein, and that one or more suitable modifications to the disclosed example embodiments, as well as other example embodiments, are intended to be included within the spirit and scope of the present disclosure as defined in the appended claims, and their equivalents.

What is claimed is:

1. A flexible medical device comprising:
   a flexible pouch comprising a first portion of a flexible metal foil bonded to a second portion of the flexible metal foil to define a hermetically sealed interior volume;
   electronic components in the hermetically sealed interior volume, the electronic components comprising flexible circuitry; and
   a case around the pouch,
   wherein the medical device has a flexible region corresponding to the flexible circuitry.

2. The flexible medical device of claim 1, wherein the flexible metal foil has a thickness in a range from about 0.00005 inches to about 0.005 inches.

3. The flexible medical device of claim 1, further comprising a feedthrough connecting the electronic components inside the pouch to an outside of the pouch, the feedthrough comprising:
   a feedthrough housing welded to a hole of the pouch;

a conductive pin extending through the hole of the pouch; and an insulating member between the conductive pin and the flexible metal foil of the pouch.

4. The flexible medical device of claim 1, wherein the case has an interior volume that is not hermetically sealed, and wherein the flexible metal foil of the pouch separates the interior volume of the case from the hermetically sealed interior volume of the pouch.

5. The flexible medical device of claim 1, wherein the case comprises a polymer.

6. The flexible medical device of claim 5, wherein the polymer is a pre-molded polymer.

7. The flexible medical device of claim 1, wherein the case comprises a coating on a surface of the pouch.

8. The flexible medical device of claim 7, wherein the coating has a first layer and a second layer, the second layer being different in material from the first layer.

9. The flexible medical device of claim 8, wherein the first layer comprises a rigid polymer, and wherein the second layer comprises a soft polymer.

10. The flexible medical device of claim 8, wherein the first layer and the second layer comprise different materials selected from the group consisting of OXPEKK-SC, a polyurethane, polysulfone, PVC, polyethylene, PEEK, polycarbonate, Ultem PEI, polypropylene, a polyimide, and silicone rubber.

11. The flexible medical device of claim 7, further comprising a rigid member in the pouch defining a non-flexing region of the flexible medical device.

12. The flexible medical device of claim 7, wherein the flexible circuitry corresponds to flexible regions of the flexible medical device.

13. The flexible medical device of claim 1, wherein the flexible medical device is an implantable pulse generator or an implantable biosensor.

14. The flexible medical device of claim 1, wherein the flexible metal foil comprises titanium, a titanium alloy, niobium, a niobium alloy, tantalum, a tantalum alloy, platinum, a platinum alloy, iridium, an iridium alloy, palladium, a palladium alloy, gold, a gold alloy, stainless steel, a Co—Ni—Cr—Mo alloy, magnesium, cobalt, a cobalt alloy, nitinol, and/or combinations thereof.

15. The flexible medical device of claim 1, wherein the electronic components further comprise a plurality of rigid components and the flexible circuitry electrically connects the plurality of rigid components within the pouch, and wherein the flexible region of the medical device is located between the rigid components and is configured to bend without compromising electrical connectivity.

16. A method of manufacturing a flexible medical device, the method comprising:

preparing a flexible metal foil;

folding the flexible metal foil around electronic components of the flexible medical device, the electronic components comprising flexible circuitry;

forming a flexible pouch having a hermetically sealed interior volume by bonding portions of the flexible metal foil to each other; and forming a case around the pouch, wherein the medical device has a flexible region corresponding to the flexible circuitry.

17. The method of claim 16, wherein the flexible metal foil has a thickness in a range from about 0.00005 inches to about 0.005 inches.

18. The method of claim 16, wherein the preparing the flexible metal foil comprises forming a hole in the flexible metal foil, and wherein the method further comprises:

inserting a feedthrough into the hole; and bonding a housing of the feedthrough to the flexible metal foil so that a hermetic seal is formed.

19. The method of claim 16, wherein the forming the case around the pouch comprises:

inserting the pouch into the case; and attaching a case cap and/or a header to close the case.

20. The method of claim 19, wherein the forming the case around the pouch further comprises molding a polymer to form the case prior to inserting the pouch into the case.

21. The method of claim 19, wherein the case has an interior volume that is not hermetically sealed.

22. The method of claim 16, wherein the forming the case around the pouch comprises applying a coating on a surface of the pouch.

23. The method of claim 22, wherein the coating has a first layer and a second layer, the second layer being different in material from the first layer.

24. The method of claim 23, wherein the first layer comprises a rigid polymer, and wherein the second layer comprises a soft polymer.

25. The method of claim 23, wherein the first layer and the second layer comprise different materials selected from the group consisting of OXPEKK-SC, a polyurethane, polysulfone, PVC, polyethylene, PEEK, polycarbonate, Ultem PEI, polypropylene, a polyimide, and silicone rubber.

26. The method of claim 16, further comprising attaching a rigid member to the pouch to define a non-flexing region of the flexible medical device.

27. The method of claim 16, wherein the flexible medical device is an implantable pulse generator or an implantable myoelectric sensor.

28. The method of claim 16, wherein the flexible metal foil comprises titanium, a titanium alloy, niobium, a niobium alloy, tantalum, a tantalum alloy, platinum, a platinum alloy, iridium, an iridium alloy, palladium, a palladium alloy, gold, a gold alloy, stainless steel, a Co—Ni—Cr—Mo alloy, magnesium, cobalt, a cobalt alloy, nitinol, and/or combinations thereof.

* * * * *